US010928433B2

(12) United States Patent
Abe et al.

(10) Patent No.: US 10,928,433 B2
(45) Date of Patent: Feb. 23, 2021

(54) METHOD AND PROGRAM FOR CALCULATING POTENTIAL, CURRENT, AND PERIPHERAL ELECTROMAGNETIC FIELD IN ELECTRIC CIRCUIT

(71) Applicant: OSAKA UNIVERSITY, Osaka (JP)

(72) Inventors: Masayuki Abe, Osaka (JP); Hiroshi Toki, Osaka (JP)

(73) Assignee: OSAKA UNIVERSITY, Osaka (JP)

( * ) Notice: Subject to any disclaimer, the term of this patent is extended or adjusted under 35 U.S.C. 154(b) by 415 days.

(21) Appl. No.: 15/758,175

(22) PCT Filed: Jun. 15, 2016

(86) PCT No.: PCT/JP2016/067767
§ 371 (c)(1),
(2) Date: Mar. 7, 2018

(87) PCT Pub. No.: WO2017/056574
PCT Pub. Date: Apr. 6, 2017

(65) Prior Publication Data
US 2018/0246154 A1    Aug. 30, 2018

(30) Foreign Application Priority Data

Sep. 30, 2015   (JP) .............................. JP2015-195118

(51) Int. Cl.
*G01R 29/08*   (2006.01)
*G01R 29/24*   (2006.01)
(Continued)

(52) U.S. Cl.
CPC ...... *G01R 29/0892* (2013.01); *G01R 19/2513* (2013.01); *G01R 29/08* (2013.01);
(Continued)

(58) Field of Classification Search
CPC .......... G06F 17/10; G06F 17/12; G06F 17/13; G01R 29/08; G01R 29/24; G01R 29/0892
See application file for complete search history.

(56) References Cited

U.S. PATENT DOCUMENTS 7,454,725 B2 * 11/2008 Yanagisawa .......... G06F 30/367
716/100
2005/0010380 A1    1/2005 Yanagisawa et al.
(Continued)

FOREIGN PATENT DOCUMENTS

| JP | 2002-373186 A | 12/2002 |
| JP | 2004-326630 A | 11/2004 |
| JP | 2005-44331 A | 2/2005 |

OTHER PUBLICATIONS

Hiroshi Toki et al., "New circuit theory of multiconductor transmission lines resulting from a new practice of noise reduction", Proceedings of the Japan Academy. Series B, Physical Andbilogical Sciences, vol. 90, No. 2, 2014, XP055581076, 2014, pp. 29-46.
(Continued)

*Primary Examiner* — Mohamed Charioui
(74) *Attorney, Agent, or Firm* — Greenblum & Bernstein, P.L.C.

(57) ABSTRACT

It is possible to comprehensively calculate a potential and a current of a transmission line in an electric circuit, a potential and a current of an element, and an electromagnetic field including noise generated from the electric circuit. A computer performs a circuit configuration inputting step of inputting a circuit configuration of a distributed constant circuit and a lumped constant circuit and an initial value of each variable, and a calculating step of obtaining a scalar potential and a current in a multi-conductor transmission line, a scalar potential and a voltage in an element, and an electromagnetic radiation amount by, under the circuit configuration and the initial value, solving a basic equation of (Continued)

a transmission theory using a boundary condition formula at x=0 and w which are the boundary between the distributed constant circuit and the lumped constant circuit.

6 Claims, 2 Drawing Sheets

(51) Int. Cl.
  *G06F 17/12* (2006.01)
  *G06F 17/13* (2006.01)
  *G06F 30/00* (2020.01)
  *G01R 19/25* (2006.01)

(52) U.S. Cl.
  CPC .............. *G01R 29/24* (2013.01); *G06F 17/12* (2013.01); *G06F 17/13* (2013.01); *G06F 30/00* (2020.01)

(56) References Cited

U.S. PATENT DOCUMENTS

| | | | | |
|---|---|---|---|---|
| 2009/0039985 A1* | 2/2009 | Sumita | .................... | H01L 23/66 |
| | | | | 333/236 |
| 2010/0085132 A1* | 4/2010 | Cheng | .................... | H01P 3/085 |
| | | | | 333/245 |

OTHER PUBLICATIONS

Search Report issued in European Patent Office (EPO) Patent Application No. 16850751.5, dated Apr. 26, 2019.

Clayton R. Paul, "Analysis of Multiconductor Transmission Lines", Wiley-Inter Science, 2008, pp. 815.

Hiroshi Told and Kenji Sato, "Multiconductor Transmission-Line Theory with Electromagnetic Radiation", Journal of the Physical Society of Japan, Jan. 15, 2012, vol. 81, Issue 1, 014201, Jan. 15, 2012, pp. 12.

Hiroshi Told and Kenji Sato, "Three Conductor Transmission Line Theory and Origin of Electromagnetic Radiation and Noise", Journal of the Physical Society of Japan, Sep. 15, 2009, vol. 78, Issue 9, 094201, pp. 8.

International Search Report issued in International Application No. PCT/JP2016/067767, dated Aug. 23, 2016 along with an English translation thereof.

Written Opinion for International Appliation PCT/JP2016/067767 dated Aug. 23, 2016 Patent Application No. PCT/JP2016/067767, dated Aug. 23, 2016 , along with an English translation thereof.

\* cited by examiner

METHOD AND PROGRAM FOR CALCULATING POTENTIAL, CURRENT, AND PERIPHERAL ELECTROMAGNETIC FIELD IN ELECTRIC CIRCUIT

TECHNICAL FIELD

The present invention relates to a method and a program for calculating a potential, a current, and a peripheral electromagnetic field, which comprehensively calculate a potential and a current of a transmission line in an electric circuit, a potential and a current of an element, and a peripheral electromagnetic field including noise generated inside and outside the electric circuit.

BACKGROUND ART

Conventionally, the investigation of an electromagnetic field around a device by simulation is performed in order of (1) input of information of a circuit constituting the device, (2) calculation of a potential and a current of a transmission line or an element based on a lumped constant circuit theory or a distributed constant circuit theory related to a multi-conductor transmission line (see Non Patent Document 1), and (3) calculation of an electromagnetic field. However, in practice, the potential and current of the transmission line and the element and the peripheral electromagnetic field interact with each other, and the electromagnetic field cannot be calculated with high accuracy in a conventional electromagnetic field calculation method which does not consider the interaction. Therefore, it was common to take countermeasures such as empirically known methods and symptomatic treatment for electromagnetic noise that has occurred as a result after designing a circuit based on the calculation result by simulation.

Under such circumstances, there was proposed a new transmission theory for comprehensively calculating a potential and a current of a transmission line, a potential and a current of an element, and an electromagnetic field including noise generated there from by fusing a multiconductor transmission line theory and an antenna theory (see Non Patent Document 2).

Equations (1) and (2) showing a conventional multiconductor transmission line theory shown in Non Patent Document 1 were created from phenomenological considerations.

[Math. 1]

$$\frac{\partial I_j(t, x)}{\partial x} = -\sum_{j=2}^{n} C_{ij} \cdot \frac{\partial V_j(t, x)}{\partial t} \quad (1)$$

[Math. 2]

$$\frac{\partial V_i(t, x)}{\partial x} = -\sum_{j=2}^{n} L_{ij} \cdot \frac{\partial I_j(t, x)}{\partial t} \quad (2)$$

($V_i$ is a potential difference (voltage) from a reference line (transmission line 1) of a transmission line i among n transmission lines, is a current flowing through the transmission line i, $C_{ij}$ and $L_{ij}$ are an electrical capacitance and an induction coefficient between transmission lines i and j respectively)

On the other hand, the new transmission theory incorporates the antenna theory into the multiconductor transmission line theory, and the basic equation is directly derived from Maxwell's equation. Hereinafter, the outline of the new transmission theory shown in Non Patent Document 2 will be described.

In the electric circuit, the transmission line is used for carrying electricity. However, the energized transmission line also functions as an antenna, and radiation of electromagnetic waves from the antenna is discussed from Maxwell's equation. Therefore, the relationship between multiconductor transmission line theory and the electromagnetic radiation from the multiconductor transmission line constituting the electric circuit is discussed based on the antenna theory given by Maxwell's equations.

It is well known that Maxwell's equation describes electromagnetic waves. A delay potential derived from the Maxwell equation at a position represented by a vector $r_v$ at time t, that is, a scalar potential $U(t, r_v)$ and a vector potential $A_v(t, r_v)$ can be written as follows.

[Math. 3]

$$U(t, r_v) = \frac{1}{4\pi\varepsilon} \int d^3 r'_v \frac{q(t - |r_v - r'_v|/c, r'_v)}{|r_v - r'_v|} \quad (3)$$

[Math. 4]

$$A_v(t, r_v) = \frac{\mu}{4\pi} \int d^3 r'_v \frac{i_v(t - |r_v - r'_v|/c, r'_v)}{|r_v - r'_v|} \quad (4)$$

($\varepsilon$ is a permittivity, $\mu$ is a permeability, c is the speed of light, and t' and $r_v$' are a time prior to time t and a position at time t' satisfying the relationship t'=t−|$r_v$−$r_v$'|/c)

That is, the scalar potential $U(t, r_v)$ and the vector potential $A_v(t, r_v)$ at the time t are based on a charge density q(t', $r_v$') and a current density vector $i_v$(t', $r_v$') at the time t' and the position $r_v$'.

Here, for each of the n parallel transmission lines having a length w, when assumed that charge and current are gathered at the center of the electric wire and the charge and the current are integrated (∫ds) by a cross-sectional area at a position x in a longitudinal direction of the transmission line, the charge $Q_i$(t, x) and the current $I_i$(t, x) per unit length of the i-th transmission line i at the time t and the position x are given by $Q_i$(t, x)=∫ds·$q_i$(t, $r_v$), and $I_i$(t, x)=∫ds·$i_i$(t, $r_v$). In addition, because of the axial symmetry, the direction of the current can be regarded as only the direction of the transmission line, that is, the x direction, so that the vector potential $A_v$(t, $r_v$) can be expressed simply as A(t, x). Then, when the distance between the center of the transmission line i and the adjacent transmission line j is $d_{ij}$, the scalar potential $U_i$(t, x) and the vector potential $A_i$(t, x) on the surface of each transmission line distant from the position x of the transmission line i by the distance $d_{ij}$ can be described as follows.

[Math. 5]

$$U_i(t, x) = \frac{1}{4\pi\varepsilon} \sum_{j=1}^{n} \int_0^w dx' \frac{Q_j\left(t - \sqrt{(x-x')^2 + d_{ij}^2}/c, x'\right)}{\sqrt{(x-x')^2 + d_{ij}^2}} \quad (5)$$

[Math. 6]

$$A_i(t, x) = \frac{\mu}{4\pi} \sum_{j=1}^{n} \int_0^w dx' \frac{I_j\left(t - \sqrt{(x-x')^2 + d_{ij}^2}/c, x'\right)}{\sqrt{(x-x')^2 + d_{ij}^2}} \quad (6)$$

From these equations, the electromagnetic field on the surface of the transmission line can be obtained, and the electromagnetic field generated around the transmission line can be obtained from the obtained electromagnetic field of the transmission line surface by the theory of electromagnetism.

$d_{ij}$ generally takes a very small value in the electric circuit. At this time, the integrands of Equations (5) and (6) have a divergent peak near $x'=x$, and need to be handled separately for the portion that does not contributes there around and the other portions. Therefore, when approximating to $Q_j(t, x')=Q_j(t, x)$ and $I_j(t, x')=I_j(t, x)$, as shown in the first term of Equations (7) and (8), it is possible to put $Q_j(t, x)$ and $I_j(t, x)$ outside the integral and analytically calculate the integral of the remaining $x'$. On the other hand, the second term in Equations (7) and (8) becomes a part that can be handled numerically by removing the diverging part.

[Math. 7]

$$U_i(t, x) = \frac{1}{4\pi\varepsilon} \sum_{j=1}^{n} \left[ \int_0^w dx' \frac{1}{\sqrt{(x-x')^2 + d_{ij}^2}} \cdot Q_j(t, x) + \int_0^w dx' \frac{Q_j\left(t - \sqrt{(x-x')^2 + d_{ij}^2}/c, x'\right) - Q_j(t, x)}{\sqrt{(x-x')^2 + d_{ij}^2}} \right] \quad (7)$$

[Math. 8]

$$A_i(t, x) = \frac{\mu}{4\pi} \sum_{j=1}^{n} \left[ \int_0^w dx' \frac{1}{\sqrt{(x-x')^2 + d_{ij}^2}} \cdot I_j(t, x) + \int_0^w dx' \frac{I_j\left(t - \sqrt{(x-x')^2 + d_{ij}^2}/c, x'\right) - I_j(t, x)}{\sqrt{(x-x')^2 + d_{ij}^2}} \right] \quad (8)$$

Since $d_{ij} \ll w$ in general, $d_{ij}=0$ can be set except for the case of $x'=x$. Therefore, the second term of Equations (7) and (8) can be expressed by using the total charge $Q_t$ and the total current $I_t$ of the n transmission lines, and Equations (7) and (8) can be expressed as Equations (9) and (11) and Equations (10) and (12), respectively.

[Math. 9]

$$U_i(t, x) = \sum_{j=1}^{n} P_{ij} \cdot Q_j(t, x) + {\sim}U(t, x) \quad (9)$$

[Math. 10]

$$A_i(t, x) = \sum_{j=1}^{n} L_{ij} \cdot I_j(t, x) + {\sim}A(t, x) \quad (10)$$

[Math. 11]

$${\sim}U(t, x) = \frac{1}{4\pi\varepsilon} \int_0^w dx' \frac{Q_t\left(t - |x-x'|/c, x'\right) - Q_t(t, x)}{|x-x'|} \quad (11)$$

[Math. 12]

$${\sim}A(t, x) = \frac{\mu}{4\pi} \int_0^w dx' \frac{I_t\left(t - |x-x'|/c, x'\right) - I_t(t, x)}{|x-x'|} \quad (12)$$

($P_{ij}$ is a potential coefficient between the transmission lines i and j, an element of an inverse matrix of a matrix having these as an element corresponds to a reciprocal number of the electrostatic capacitance $C_{ij}$. $L_{ij}$ is an induction coefficient between the transmission lines i and j.)

${\sim}U(t, x)$ in Equation (11) and ${\sim}A(t, x)$ in Equation (12) corresponding to the second term in Equations (7) and (8) respectively include a potential delay, which represents an electromagnetic wave emission and absorption process, that is, an antenna process (see Non Patent Document 2).

The electromagnetic potential generated from these charges and currents affects the charge current in the transmission line. In macroscopic systems dealing with electromagnetics, it is possible to use the phenomenological Ohm's law which does not directly handle charge motion and describes its average behavior. Specifically, when a resistance $R_i$ determined from the property of the transmission line i is given, the current $I_i(t, x)$ at the position when the electric field $E(t, x)$ is given is expressed by $$E_i(t,x) = R_i \cdot I_i(t,x) \quad (13).$$

By expressing Equation (13) by potential, the following equation that the current is determined when the electromagnetic potential is given is obtained.

[Math. 13]

$$-\frac{\partial U_i(t, x)}{\partial x} - \frac{\partial A_i(t, x)}{\partial t} = R_i \cdot I_i(t, x) \quad (14)$$

Furthermore, the equation of continuity between Q and I is considered.

[Math. 14]

$$\frac{\partial Q_i(t, x)}{\partial x} + \frac{\partial I_i(t, x)}{\partial t} = 0 \quad (15)$$

Since four Equations (9), (10), (14), and (15) are given to four variables of the two potentials (U, A) and the two charge currents (Q, I), it is possible to solve these equations by giving appropriate boundary conditions.

By calculating the time derivative of the potentials of Equations (9) and (10) and then eliminating A and Q by using Equations (14) and (15), two Equations (16) and (17) are obtained. These two partial differential equations are basic equations of a new transmission theory incorporating an antenna theory into a multiconductor transmission line theory, which is directly derived from Maxwell's equation. Both equations are equations expressing the amount of change in scalar potential, that is, the amount of change in potential, by using the amount of change in current.

[Math. 15]

$$\frac{\partial U_i(t, x)}{\partial t} = -\sum_{j=1}^{n} P_{ij} \cdot \frac{\partial I_j(t, x)}{\partial x} + \frac{\partial {\sim}U(t, x)}{\partial t} \quad (16)$$

[Math. 16]

$$\frac{\partial U_i(t, x)}{\partial x} = -\sum_{j=1}^{n} L_{ij} \cdot \frac{\partial I_j(t, x)}{\partial t} - \frac{\partial {\sim}A(t, x)}{\partial t} - R_i \cdot I_i(t, x) \quad (17)$$

The basic equation of the conventional multiconductor transmission line theory shown in Equations (1) and (2) can be rewritten on the same left side as in Equations (16) and (17) by using the potential coefficient $P_{ij}$ and potential (see Non Patent Document 3).

[Math. 17]

$$\frac{\partial U_i(t,x)}{\partial t} = -\sum_{j=1}^{n} P_{ij} \cdot \frac{\partial I_j(t,x)}{\partial x} \quad (18)$$

[Math. 18]

$$\frac{\partial U_i(t,x)}{\partial x} = -\sum_{j=1}^{n} L_{ij} \cdot \frac{\partial I_j(t,x)}{\partial t} \quad (19)$$

As can be seen by comparing the right side of Equations (16) and (17) with the right side of Equations (18) and (19), the first term on the right side of Equations (16) and (17) coincides with the right side of Equations (18) and (19). That is, Equations (16) and (17), which are basic equations of new transmission theory, include Equations (18) and (19) of the conventional multi-conductor transmission theory created from phenomenological considerations. Equations (16) and (17) additionally include the antenna term ~U(t, x) and ~A(t, x) representing the antenna process, respectively.

PRIOR ART REFERENCES

Non Patent Document

Non Patent Document 1: Clayton R. Paul, "Analysis of Multiconductor Transmission Lines", Wiley-Inter-Science, 2008
Non Patent Document 2: Hiroshi Toki and Kenji Sato, "Multiconductor Transmission-Line Theory with Electromagnetic Radiation", Journal of the Physical Society of Japan, January 2012, Vol. 81, 014201
Non Patent document 3: Hiroshi Toki and Kenji Sato, "Three Conductor Transmission Line Theory and Origin of Electromagnetic Radiation and Noise", Journal of the Physical Society of Japan, January 2009, Vol. 78, 094201

SUMMARY OF THE INVENTION

Problems to be Solved by the Invention

The basic equations of the new transmission theory described as the background art can be solved by giving appropriate boundary conditions. However, the method of setting the boundary conditions has been clarified only in the limited cases such as one resistor and one capacitor, and a specific calculation method under the boundary condition to which an arbitrary lumped constant circuit is connected has not been clarified.

An object of the present invention to provide an efficient calculation method under the boundary condition while giving an appropriate boundary condition to a basic equation of a new transmission theory and thus to provide a method and a program of calculating a potential, a current, and a peripheral electromagnetic field in an electric circuit, which can comprehensively calculate a potential and a current of a multi-conductor transmission line constituting a distributed constant circuit, a potential and a current of an element constituting a lumped constant circuit connected to the multi-conductor transmission line, and an electromagnetic field including noise generated inside and outside the electric circuit.

Means for Solving the Problems (1) There is provided a method for calculating a potential, a current, and a peripheral electromagnetic field in an electric circuit, which causes a computer to calculate a potential and a current in a multi-conductor transmission line constituting a distributed constant circuit, a potential and a current in an element constituting a lumped constant circuit connected to the multi-conductor transmission line, and an electromagnetic radiation amount from each circuit, the method including: a circuit configuration inputting step of inputting a circuit configuration of the distributed constant circuit and the lumped constant circuit and an initial value of each variable; and a calculating step of obtaining the potential and the current in the multi-conductor transmission line, the potential and the current in the element, and the electromagnetic radiation amount by solving:

under the circuit configuration and the initial value, the following basic equations of new transmission theory:

[Math. 19]

$$\frac{\partial U_i(t,x)}{\partial t} = -\sum_{j=1}^{n} P_{ij} \cdot \frac{\partial I_j(t,xc)}{\partial x} + \frac{\partial \tilde{U}(t,x)}{\partial t} \quad (20)$$

[Math. 20]

$$\frac{\partial U_i(t,x)}{\partial x} = -\sum_{j=1}^{n} L_{ij} \cdot \frac{\partial I_j(t,x)}{\partial t} - \frac{\partial \tilde{A}(t,x)}{\partial t} - R_i \cdot I_i(t,x) \quad (21)$$

[Math. 21]

$$\tilde{U}(t,x) = \frac{1}{4\pi\varepsilon} \int_0^w dx' \frac{Q_t(t-\sqrt{|x-x'|}/c, x') - Q_t(t,x)}{|x-x'|} \quad (22)$$

[Math. 22]

$$\tilde{U}(t,x) = \frac{1}{4\pi\varepsilon} \int_0^w dx' \frac{Q_t(t-\sqrt{|x-x'|}/c, x') - Q_t(t,x)}{|x-x'|} \quad (23)$$

using a boundary condition formula at x=0 and w which are boundaries between the distributed constant circuit and the lumped constant circuit:

$$U_i(t,x) - U_j(t,x) = V_{ij}(t) + Z_{ij} \cdot \Delta \cdot I_{ij}(t) \quad (24), \text{ and}$$

Kirchhoff's current law, that is, a summation formula in which an algebraic sum of branch currents of all the branches flowing into one node is zero, that is, a current flowing out from the node is positive and a current entering the node is negative:

$$\alpha \cdot I_i(t,x) + \Sigma_{j(\neq i)} I_{ij}(t) = 0 \quad (25)$$

(t is a time, x and x' are positions on each transmission line (x>x'), i, j (=1, 2, ..., n) is the number of each transmission line, $U_i$(t, x) and $A_i$(t, x) are scalar potential (potential) and vector potential of a transmission line i at time t and a position x, respectively, $I_i$(t, x) is a current flowing in a transmission line j at the time t and the position x, $P_{ij}$ and $L_{ij}$ are a potential coefficient and an induction coefficient between the transmission lines i and j respectively, $R_i$ is a resistance per unit length of the transmission line i, ~U(t, x) and ~A(t, x) are antenna terms indicating the electromagnetic radiation amount at the time t and the position x, ε is a permittivity, μ is a permeability, $Q_t(t, x)$ and $I_t(t, x)$ are a charge and a current of all transmission lines at the time t and the position x, $V_{ij}(t)$ is a power supply voltage connected between the nodes i, j ($\neq$i) at the time t on the lumped constant circuit side, $I_{ij}(t)$ is a current flowing from the node i to the node j ($\neq$i) at the time t on the lumped constant circuit side, $Z_{ij}$ is a load connected between the nodes i, j ($\neq$i), Δ is 1 when $Z_{ij}=R_{ij}$, d/dt when $Z_{ij}=L_{ij}$, and $(d/dt)^{-1}$ when $Z_{ij}=1/C_{ij}$, and α is 1 when x=0 and −1 when x=w).

In this way, by giving the boundary conditions to the basic equations of the new transmission theory, it is possible to comprehensively calculate the potential and current in the multi-conductor transmission line constituting the constant circuit, the potential and the current in the element constituting the lumped constant circuit connected to the multi-conductor transmission line, and the electromagnetic fields including noise generated from each circuit.

(2) The calculation of the basic equations of the new transmission theory can be performed efficiently by using the Finite Difference Time Domain (FDTD) method. In the boundary condition between the transmission line part and the lumped circuit part, the calculation is possible by using the result calculated by FDTD and the theory based on the circuit theory used on lumped constant side. Specifically, on the lumped constant side, Kirchhoff's voltage law, Kirchhoff's current law, and the voltage-current characteristics of the element can be used.

(3) In the case of performing the calculation by using the FDTD method, when a scalar potential at a position x=k·Δx (k=0, 1, ..., N, w=N·Δx) and time t=m·Δt (m=0, 1, ..., arbitrary) on the transmission line i is $U_k^m$, a current is denoted as $I_k^m$, $Uv_k^m$ is a vector with $U_k^m$ as an element for each transmission line i, $Iv_k^m$ is a vector whose elements are $I_k^m$ for each transmission line i, $P_d$ is a matrix whose elements are $P_{ij}$, $L_d$ is a matrix whose elements are $L_{ij}$, and $R_d$ is a matrix whose diagonal element is $R_i$, Equation (20) may be discretized into

[Math. 23]

$$\frac{Uv_k^{m+1} - Uv_k^m}{\Delta t} = -P_d \frac{Iv_{k+1/2}^{m+1/2} - Iv_{k-1/2}^{m+1/2}}{\Delta x} + \frac{\tilde{U}_k^{m+1} - \tilde{U}_k^m}{\Delta t} \quad (26)$$

and Equation (21) may be discretized into

[Math. 24]

$$\frac{Uv_{k+1}^{m+1} - Uv_k^{m+1}}{\Delta x} =$$
$$-L_d \frac{Iv_{k+1/2}^{m+3/2} - Iv_{k+1/2}^{m+1/2}}{\Delta t} - \frac{\tilde{A}_{k+1/2}^{m+1/2} - \tilde{A}_{k+1/2}^{m-1/2}}{\Delta t} - R_d \frac{Iv_{k+1/2}^{m+3/2} - Iv_{k+1/2}^{m+1/2}}{2} \quad (27)$$

(4) When $Zc_d$ is a matrix having a characteristic impedance $Zc_{ij}$ between the transmission lines i and j as an element, Equation (26) may be transformed as follows when k=0 which is a boundary of one of the distributed constant circuit and the lumped constant circuit

[Math. 25]

$$Uv_0^{m+1} - Zc_d \cdot Iv_0^{m+1} = Uv_0^m + Zc_d \cdot (Iv_0^m - 2Iv_{1/2}^{m+1/2}) \quad (28)$$

in addition, at k=N which is the other boundary, Equation (26) may be transformed as follows

[Math. 26]

$$-Uv_N^{m+1} - Zc_d \cdot Iv_N^{m+1} = -Uv_N^m + Zc_d \cdot (Iv_N^m - 2Iv_{N-1/2}^{m+1/2}) \quad (29)$$

and Equations (28) and (29) after the transformation may be solved using the following discretized boundary condition formulas for k=0 and N corresponding to Equations (24) and (25),

[Math. 27]

$$(U_i^{m+1} - U_j^{m+1}) - Z_{ij} \cdot I_{ij}^{m+1} = -\gamma_{ij}(U_i^m - U_j^m) + \delta_{ij} \cdot Z_{ij} \cdot I_{ij}^m + V_{ij}^{m+1} + V_{ij}^m \quad (30)$$

[Math. 28]

$$\beta \cdot I_i^{m+1} + \Sigma_{j(\neq i)} I_{ij}^{m+1} = 0 \quad (31)$$

(when $Z_{ij}=R_{ij}$, $\gamma_{ij}=1$ and $\delta_{ij}=1$, when $Z_{ij}=2L_{ij}/\Delta t$, $\gamma_{ij}=1$ and $\delta_{ij}=-1$, and when $Z_{ij}=\Delta t/2C_{ij}$, $\gamma_{ij}=-1$ and $\delta_{ij}=1$, and β is 1 when k=0 and −1 when k=N).

(5) When a connection matrix indicating the presence or absence of involvement in each node connection and the presence or absence of connection with each transmission line in each node is $A_d$, a vector having the current $I_i$ flowing between the respective nodes and the current $I_i$ flowing through each transmission line as an element is vI, a matrix having elements of the impedance $Z_{ij}$ between the respective nodes and the characteristic impedance $Zc_{ij}$ between the transmission lines $Z_d$, diagonal matrices with $\gamma_{ij}$ and $\gamma_{ij}$ as elements corresponding to a type of elements connected between the nodes are $\gamma_d$ and $\delta_d$, and a vector having the voltage $V_{ij}$ applied between the nodes as an element is $V_v$, Equations (28), (30), and (31) are expressed in a form of a matrix:

[Math. 29]

$$\begin{pmatrix} A_d^T & -Z_d \\ 0 & A_d \end{pmatrix} \begin{pmatrix} Uv_0^{m+1} \\ vI_0^{m+1} \end{pmatrix} =$$
$$-\begin{pmatrix} \gamma_d \cdot A_d^T & -\delta_d \cdot Z_d \\ 0 & 0 \end{pmatrix} \begin{pmatrix} Uv_0^m \\ vI_0^m - 2vI_{1/2}^{m+1/2} \end{pmatrix} + \begin{pmatrix} Vv^{m+1} + Vv^m \\ 0 \end{pmatrix} \quad (32)$$

Equations (29), (30), and (31) are expressed in a form of a matrix:

[Math. 30]

$$\begin{pmatrix} A_d^T & -Z_d \\ 0 & A_d \end{pmatrix} \begin{pmatrix} Uv_N^{m+1} \\ vI_N^{m+1} \end{pmatrix} =$$
$$-\begin{pmatrix} \gamma_d \cdot A_d^T & -\delta_d \cdot Z_d \\ 0 & 0 \end{pmatrix} \begin{pmatrix} Uv_N^m \\ vI_N^m - 2vI_{N-1/2}^{m+1/2} \end{pmatrix} + \begin{pmatrix} Vv^{m+1} + Vv^m \\ 0 \end{pmatrix} \quad (33)$$

and each equation may be solved.

(6) When considering the insertion of a current source between nodes i and j, Equation (31) is

[Math. 31]

$$(A_d \ A_{dJ})\begin{pmatrix} vI_0^{m+1} \\ vI_{J0}^{m+1} \end{pmatrix} = 0 \quad (34)$$

($A_d$ is a connection matrix indicating the presence or absence of involvement in each node connection not including a current source and the presence or absence of connection with each transmission line in each node, $A_{dJ}$ is a connection matrix indicating the presence or absence of involvement in each node connection including the current source at each node, $vI_0^{m+1}$ is a vector whose elements are a current $I_{ij0}^{m+1}$ flowing between the respective nodes to which no current source is connected and a current $I_{i0}^{m+1}$ flowing through each transmission line, and $vI_{J0}^{m+1}$ is a vector whose elements are a current $I_{Jij0}^{m+1}$ flowing between the nodes to which the current source is connected) is used, and Equations (28), (30), and (34) is expressed in a form of a matrix

[Math. 32]

$$\begin{pmatrix} A_d^T & -Z_d \\ 0 & A_d \end{pmatrix}\begin{pmatrix} Uv_0^{m+1} \\ vI_0^{m+1} \end{pmatrix} = \quad (35)$$

$$-\begin{pmatrix} \gamma_d \cdot A_d^T & -\delta_d \cdot Z_d \\ 0 & 0 \end{pmatrix}\begin{pmatrix} Uv_0^m \\ vI_0^m - 2vI_{1/2}^{m+1/2} \end{pmatrix} + \begin{pmatrix} Vv^{m+1} + Vv^m \\ -A_{dJ} \cdot vI_{I0}^{m+1} \end{pmatrix}$$

Equations (29), (30), and (34) are expressed in a form of a matrix:

[Math. 33]

$$\begin{pmatrix} A_d^T & -Z_d \\ 0 & A_d \end{pmatrix}\begin{pmatrix} Uv_N^{m+1} \\ vI_N^{m+1} \end{pmatrix} = \quad (36)$$

$$-\begin{pmatrix} \gamma_d \cdot A_d^T & -\delta_d \cdot Z_d \\ 0 & 0 \end{pmatrix}\begin{pmatrix} Uv_N^m \\ vI_N^m - 2vI_{N-1/2}^{m+1/2} \end{pmatrix} + \begin{pmatrix} Vv^{m+1} + Vv^m \\ -A_{dJ} \cdot vI_{IN}^{m+1} \end{pmatrix}$$

and each equation may be solved.

(7) In the value of the antenna term ~U and ~A, when a total charge of all the transmission lines at the position x=k·Δx and the time t=m·Δt on the transmission line is $Qt_k^m$ and a total current is $It_k^m$, a value of $Qt_k^{m+1}$ is calculated by

[Math. 34]

$$\frac{Qt_k^{m+1} - Qt_k^m}{\Delta t} + \frac{It_{k+1/2}^{m+1/2} - It_{k-1/2}^{m+1/2}}{\Delta x} = 0 \quad (37)$$

and the values of the antenna terms ~U and ~A may be calculated by the followings Equations.

[Math. 35]

$$\sim U_k^{m+1} = \quad (38)$$

$$\frac{1}{4\pi\varepsilon}\left[\sum_{k'=0}^{k} \frac{Qt_{k'}^{m+1-(k-k')} - Qt_k^{m+1}}{k-k'} + \sum_{k'=k}^{N} \frac{Qt_{k'}^{m+1+(k-k')} - Qt_k^{m+1}}{-(k-k')}\right]$$

[Math. 36]

$$\sim A_{k+1/2}^{m+1/2} = \quad (39)$$

$$\frac{\mu}{4\pi}\left[\sum_{k'=0}^{k} \frac{It_{k'+1/2}^{m+1/2-(k-k')} - It_{k+1/2}^{m+1/2}}{k-k'} + \sum_{k'=k}^{N} \frac{It_{k'+1/2}^{m+1/2+(k-k')} - It_{k+1/2}^{m+1/2}}{-(k-k')}\right]$$

(8) The calculating step may repeatedly perform: in m=0, a first calculating sub-step of calculating $Uv_0^1$ and $vI_0^1$ by Equation (35); a second calculating sub-step of calculating $Qt_0^1$ by Equation (37); a third calculating sub-step of calculating $\sim U_0^1$ by Equation (38); a fourth calculating sub-step of calculating $Qt_k^1$ (k=1, 2, ..., N−1) by Equation (37); a fifth calculating sub-step of calculating $\sim U_k^1$ (k=1, 2, ..., N−1) by Equation (38); a sixth calculating sub-step of calculating $Uv_k^1$ (k=1, 2, ..., N−1) by Equation (26); a seventh calculating sub-step of calculating $Uv_N^1$ and $vI_N^1$ by Equation (36); an eighth sub-step of calculating $Qt_N^1$ by Equation (37); a ninth calculating sub-step of calculating $\sim U_N^1$ by Equation (38); a tenth calculating sub-step of calculating $\sim A_{k+1/2}^{1/2}$ (k=0, 1, ..., N−1) by equation (39); and an eleventh calculating sub-step of calculating $Iv_{k+1/2}^{3/2}$ (k=0, 1, ..., N−1) by Equation (27), and in m≥1, an twelfth calculating sub-step of calculating $Uv_0^{m+1}$ and $vI_0^{m+1}$ by Equation (35); a thirteenth sub-step of calculating $Qt_0^{m+1}$ by Equation (37); a fourteenth calculating sub-step of calculating $\sim U_0^{m+1}$ (k=1, 2, ..., N−1) by Equation (38); a fifteenth sub-step of calculating $Qt_k^{m+1}$ (k=1, 2, ..., N−1) by Equation (37); a sixteenth calculating sub-step of calculating $\sim U_k^{m+1}$ (k=1, 2, ..., N−1) by Equation (38); a seventeenth calculating sub-step of calculating $Uv_k^{m+1}$ (k=1, 2, ..., N−1) by Equation (26); an eighteenth calculating sub-step of calculating $Uv_N^{m+1}$ and $vI_N^{m+1}$ by Equation (36); a nineteenth calculating sub-step of calculating $Qt_N^{m+1}$ by Equation (37); a twentieth calculating sub-step of calculating $\sim U_N^{m+1}$ by Equation (38); a twenty-first calculating sub-step of calculating $\sim A_{k+1/2}^{m+1/2}$ (k=0, 1, ..., N−1) by Equation (39); and a twenty-second calculating sub-step of calculating $Iv_{k+1/2}^{1+3/2}$ (k=0, 1, 2, ..., N−1) by Equation (27) until a value of m reaches a predetermined value while incrementing m by 1.

Therefore, it is possible to comprehensively calculate the potential and current in the multi-conductor transmission line constituting the distributed constant circuit, the potential and the current in the element constituting the lumped constant circuit connected to the multi-conductor transmission line, and the electromagnetic fields including noise generated from each circuit, without performing a complicated calculation.

DESCRIPTION OF EMBODIMENTS

<Boundary Condition>

It is a basic equation of a new transmission theory described as the background art.

[Math. 37]

$$\frac{\partial U_i(t,x)}{\partial t} = -\sum_{j=1}^{n} P_{ij} \cdot \frac{\partial I_j(t,x)}{\partial x} + \frac{\partial \tilde{U}(t,x)}{\partial t} \quad (16)$$

[Math. 38]

$$\frac{\partial U_i(t,x)}{\partial x} = -\sum_{j=1}^{n} L_{ij} \cdot \frac{\partial I_j(t,x)}{\partial t} - \frac{\partial \tilde{A}(t,x)}{\partial t} - R_i \cdot I_i(t,x) \quad (17)$$

[Math. 39]

$$\tilde{U}(t,x) = \frac{1}{4\pi\varepsilon} \int_0^w dx' \frac{Q_t(t-\sqrt{|x-x'|}/c,x') - Q_t(t,x)}{|x-x'|} \quad (11)$$

[Math. 40]

$$\tilde{A}(t,x) = \frac{\mu}{4\pi} \int_0^w dx' \frac{I_t(t-\sqrt{|x-x'|}/c,x') - I_t(t,x)}{|x-x'|} \quad (12)$$

Figure 1:
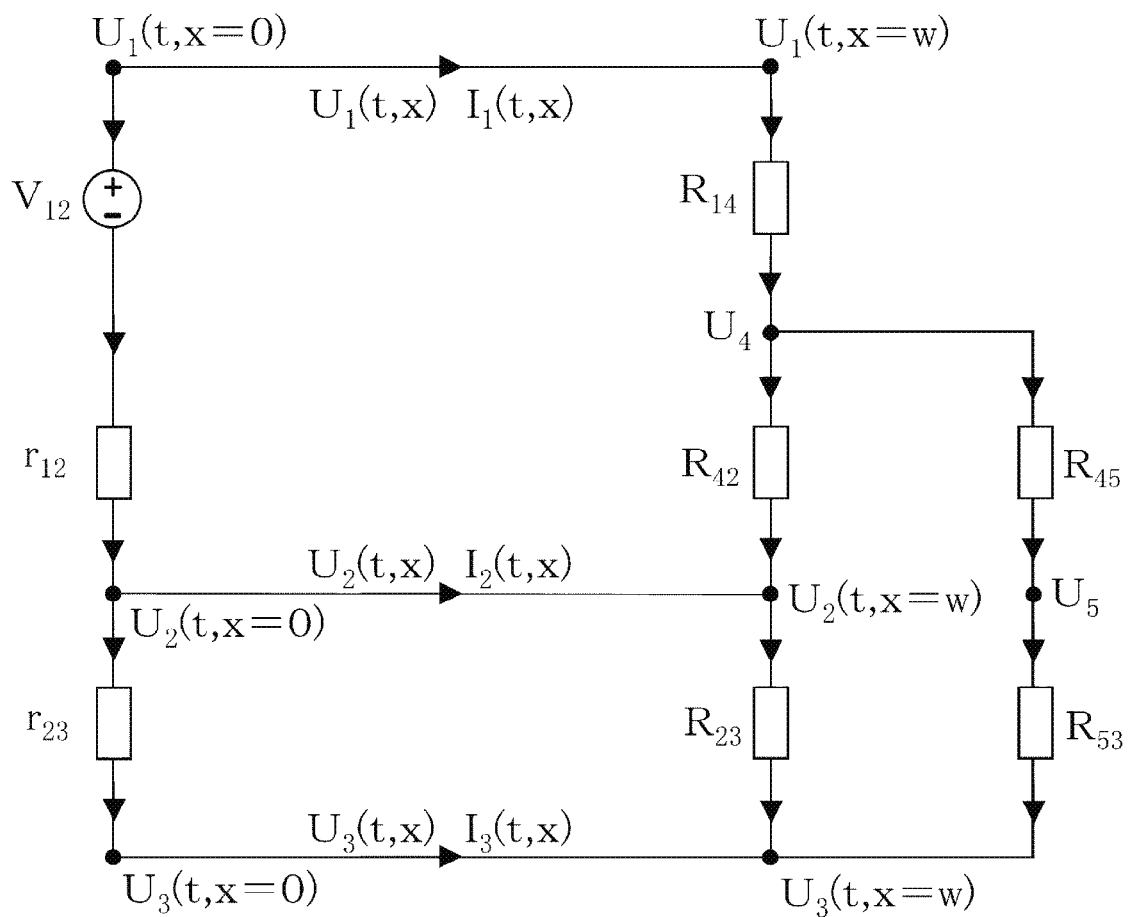
FIG. 1 is a diagram illustrating an example of a circuit configuration to which a calculation method of the present invention is applied.

In order to solve these equations, it is necessary to provide an appropriate boundary condition between a transmission line which is a distributed constant circuit and a power supply or load which is a lumped constant circuit, FIG. 1 shows a configuration example of an electric circuit in which a power supply $V_{ij}(t)$ and a resistor $r_{ij}$ are connected to one end (power supply side) of an n-conductor transmission line and a resistor $R_{ij}$ is connected to the other end (load side). Here, t is the time, subscripts i and j are the numbers of the transmission line and the node, the transmission line i is connected to the node i of the same subscript, and is a transmission line and node different from i. ij is the number indicating between the transmission lines i and j and between the nodes i and j. In FIG. 1, as a specific example, in a three-conductor transmission line, at the power supply side boundary (x=0) which is one end of each transmission line, a power supply $V_{12}$ and a resistor $r_{12}$ are connected between the transmission lines 1 and 2 (between the nodes 1 and 2), and a resistor $r_{23}$ is connected between the transmission lines 2 and 3 (between the nodes 2 and 3). On the load side boundary (x=w (w is the transmission line length)) which is the other end of each transmission line, $R_{12}$ is connected between the transmission line 1 (node 1) and the node 4, $R_{42}$ is connected between the node 4 and the transmission line 2 (node 2), $R_{23}$ is connected between the transmission lines 2 and 3 (between the nodes 2 and 3), $H_{45}$ is connected between the node 4 and the node 5, and $R_{53}$ is connected between the node 5 and the transmission line 3 (node 3). In addition, $U_i(t,x)$ and $I_i(t,x)$ are the scalar potential (potential) and current at the time t and the position x on the transmission line i, respectively. Note that the scalar potential (potential) corresponds to the potential of the node of the lumped constant circuit at the boundary (x=0 and x=w).

Under such a circuit configuration, the following boundary condition formula can be obtained from the Ohm's law at the power supply side boundary.

$$U_i(t,x=0) - U_j(t,x=0) = V_{ij}(t) + r_{ij} \cdot I_{ij}(t) \quad (40)$$

In addition, in the connection node i between the transmission line i and the power supply or the like, the following boundary condition formula can be further obtained from the law of current conservation.

$$I_i(t,x=0) + \Sigma_{j(\neq i)} I_{ij}(t) = 0 \quad (41)$$

Note that Equation (41) assumes that the current flows in the direction indicated by the arrow in FIG. 1 and is established under the definition that the direction flowing out from the connection node is a positive direction and the direction flowing into the connection node is a negative direction. In the following, in order to match the current calculation of the whole circuit, the definition of the direction of the current in the current calculation formula is the same as this.

On the other hand, the next boundary condition formula can be obtained from the Ohm's law even at the load side boundary.

$$U_i(t,x=w) - U_j(t,x=w) = V_{ij}(t) + R_{ij} \cdot I_{ij}(t) \quad (42)$$

Equation (42) also includes a power supply term similarly to Equation (40) on the power supply side. This is because it is assumed that the power supply is inserted $V_{ij}(t)=0$ in the case of the example of FIG. 1 in which the power supply is not inserted.

In addition, the following boundary condition formula can be obtained from the law of current conservation even at the connection node i between the transmission line i and the load.

$$-I_i(t,x=w) + \Sigma_{j(\neq i)} I_{ij}(t) = 0 \quad (43)$$

The sign of Equation (41) on the power supply side is different from the sign of because the current flows out from the power supply side connection node, whereas the current flows into the load side connection node.

In FIG. 1, a case where the resistor $R_{ij}$ is connected as a load is exemplified. However, when the inductor $L_{ij}$ and the capacitor $C_{ij}$ are connected, Equation (42) has the following form.

[Math. 41]

$$U_i(t,x) - U_j(t,x) = V_{ij}(t) + L_{ij}\frac{d}{dt}I_{ij}(t) \quad (44)$$

[Math. 42]

$$\frac{d}{dt}(U_i(t,x) - U_j(t,x)) = \frac{d}{dt}V_{ij}(t) + C_{ij}^{-1} \cdot I_{ij}(t) \quad (45)$$

Then, Equations (92), (44), and (45) can be generalized as follows.

$$U_i(t,x) - U_j(t,x) = V_{ij}(t) + Z_{ij} \cdot \Delta \cdot I_{ij}(t) \quad (46)$$

In Equation (46), $\Delta$ is 1 when $Z_{ij}=R_{ij}$, d/dt when $Z_{ij}=L_{ij}$, and $(d/dt)^{-1}$ when $Z_{ij}=1/C_{ij}$.

In this way, by giving the boundary conditions to the basic equations of the new transmission theory, it is possible to comprehensively calculate the potential and current of the transmission line in the electric circuit, the potential and current of the element, and the electromagnetic field including noise generated from the electric circuit.

<Application of FDTD Method>

The calculation of the basic equations (16) and (17) of the new transmission theory can be performed efficiently by using a Finite Difference Time Domain (FDTD) method. In the FDTD method analysis is performed by a structure called a Yee grid that shifts the grid where the unknown electric field is arranged and the grid where the unknown magnetic field is arranged by half the width of the grid. In the FDTD method, the Maxwell's equation (Faraday's electromagnetic induction law and Ampere's law) is spatially and temporally differentiated by relational expressions working between these unknown electric and magnetic fields and adjacent unknown electric field and magnetic field (discretization), and based on this, the unknown electric field and the magnetic field are updated in units of certain time steps to obtain the whole electromagnetic field behavior. According to this analysis method, the electric field and the magnetic field can be obtained alternately by updating the electric field at a certain time step, updating the magnetic field after 1/2 time step, and updating the electric field after one time step. In particular, by setting the interval of the grid used for discretizing the space and time to be sufficiently small, it is possible to simulate the temporal change of the electromagnetic field in detail and efficiently. In the present invention, this technique is used for obtaining the potential and the current in the transmission line. In the boundary condition between the transmission line part and the lumped circuit part, the calculation is possible by using the result calculated by FDTD and the theory based on the circuit theory used on lumped constant side. Specifically, on the lumped constant side, Kirchhoff's voltage law, Kirchhoff's current law, and the voltage-current characteristics of the element can be used.

First, it is necessary to discretize the basic equations (16) and (17) of the new transmission theory when performing the calculation by using the FDTD method. At this time, at the position $x = k \cdot \Delta x$ ($k = 0, 1, \ldots, N$, $w = N \cdot \Delta x$) on the transmission line $i$ and the time $t = m \cdot \Delta t$ ($m = 0, 1, \ldots$ arbitrary), the scalar potential is expressed as $U_k^m$ and the current is expressed as $I_k^m$. In a case where the part of k is $k+1/2$ and the part of m is $m+1/2$, it is expressed as $I_{k+1/2}^{m+1/2}$. In this way, the grid of the FDTD method is defined in a range from 0 to the transmission line length w in the x direction and in a range up to an arbitrary time in the t direction. At this time, Equations (16) and (17) can be discretized as shown in, for example, Equations (47) and (48).

[Math. 43]

$$\frac{Uv_k^{m+1} - Uv_k^m}{\Delta t} = -P_d \frac{Iv_{k+1/2}^{m+1/2} - Iv_{k-1/2}^{m+1/2}}{\Delta x} + \frac{{\sim}U_k^{m+1} - {\sim}U_k^m}{\Delta t} \quad (47)$$

[Math. 44]

$$\frac{Uv_{k+1}^{m+1} - Uv_k^{m+1}}{\Delta x} = -L_d \frac{Iv_{k+1/2}^{m+3/2} - Iv_{k+1/2}^{m+1/2}}{\Delta t} - \frac{{\sim}A_{k+1/2}^{m+1/2} - {\sim}A_{k+1/2}^{m-1/2}}{\Delta t} - R_d \frac{Iv_{k+1/2}^{m+3/2} - Iv_{k+1/2}^{m+1/2}}{2} \quad (48)$$

Here, $Uv_k^m$ is a vector with $U_k^m$ as the element for each transmission line i, $Iv_k^m$ is a vector with $I_k^m$ as the element for each transmission line i, $P_d$ is a matrix with $P_{ij}$ as its element, $L_d$ is a matrix with $L_{ij}$ as its element, and $R_d$ is a matrix with $R_i$ as a diagonal element.

<Boundary Condition in Case of FDTD Method>

Next, the discretized basic equations are solved by giving the boundary conditions. Since the effect of the antenna is generated on the transmission line and is not generated at the boundary portion which is the end of the transmission line, it is possible to solve the equation with the antenna term removed from the basic equation. The following is obtained by simply substituting k=0 indicating the boundary position of one of the distributed constant circuit and the lumped constant circuit to the equation obtained by removing the antenna term ~U from Equation (47).

[Math. 45]

$$\frac{Uv_0^{m+1} - Uv_0^m}{\Delta t} = -P_d \frac{Iv_{1/2}^{m+1/2} - Iv_{-1/2}^{m+1/2}}{\Delta x} \quad (49)$$

At this time, since the term of $Iv_{-1/2}^{m+1/2}$ becomes x<0 and falls outside the definition range of the grid, it is transformed as follows so that it falls within the definition range and the error becomes small.

[Math. 46]

$$\frac{Uv_0^{m+1} - Uv_0^m}{\Delta t} = -P_d \frac{Iv_{1/2}^{m+1/2} - \frac{1}{2}(Iv_0^{m+1} + Iv_0^m)}{\Delta x/2} \quad (50)$$

Such a transformation is similarly performed when $Qt_0^1$ is determined. Furthermore, when the signal is transmitted at the speed of light c on the transmission line and $Zc_d$ is a matrix having the characteristic impedance $Zc_{ij}$ between the transmission lines i and j as an element, $Zc_{ij} = P_{ij}/c$ and $c \cdot \Delta t = \Delta x$, and thus Equation (50) can be transformed as follows.

[Math. 47]

$$Uv_0^{m+1} - Zc_d \cdot Iv_0^{m+1} = Uv_0^m + Zc_d \cdot (Iv_0^m - 2Iv_{1/2}^{m+1/2}) \quad (51)$$

In addition, the following is obtained by simply substituting k=N indicating the boundary position of the other of the distributed constant circuit and the lumped constant circuit to the equation obtained by removing the antenna term ~U from Equation (47).

[Math. 48]

$$\frac{Uv_N^{m+1} - Uv_N^m}{\Delta t} = -P_d \frac{Iv_{N+1/2}^{m+1/2} - Iv_{N-1/2}^{m+1/2}}{\Delta x} \quad (52)$$

At this time, since the term of $Iv_{N+1/2}^{m+1/2}$ becomes x>w and falls outside the definition range of the grid, it is transformed as follows so that it falls within the definition range and the error becomes small.

[Math. 49]

$$\frac{Uv_N^{m+1} - Uv_N^m}{\Delta t} = -P_d \frac{\frac{1}{2}(Iv_N^{m+1} + Iv_N^m) - Iv_{N-1/2}^{m+1/2}}{\Delta x/2} \quad (53)$$

Such a transformation is similarly performed when $Qt_N^1$ is determined. Furthermore, Equation (53) can be transformed as follows.

[Math. 50]

$$-Uv_N^{m+1} - Zc_d \cdot Iv_N^{m+1} = -Uv_N^m + Zc_d \cdot (Iv_N^m - 2Iv_{N-1/2}^{m+1/2}) \quad (54)$$

The reason why Equation (51) in the case of k=0 and the sign of the first term on both sides are different is because when the direction of the current is k=0, the current flows out from the connection node toward the transmission line, and in the case of k=N, current is defined to flow from the transmission line to the connection node.

The boundary conditions are given to the discretized basic equations (51) and (54) in this way. When the resistor $R_{ij}$, the inductor $L_{ij}$ or the capacitor $C_{ij}$ is connected between the transmission lines i and j and the current flowing therethrough is $I_{ij}(t)$, the following boundary condition formula is obtained from Ohm's law. Note that a case where the power supply $V_{ij}(t)$ is connected between the transmission lines i and j together with these loads will be omitted herein for simplicity of the equation.

$$U_i(t, x) - U_j(t, x) = R_{ij} \cdot I_{ij}(t) \quad (55)$$

[Math. 51]

$$U_i(t, x) - U_j(t, x) = L_{ij} \frac{d}{dt} I_{ij}(t) \quad (56)$$

[Math. 52]

$$\frac{d}{dt}(U_i(t, x) - U_j(t, x)) = C_{ij}^{-1} \cdot I_{ij}(t) \quad (57)$$

When these equations are discretized, they become as follows.

[Math. 53]

$$\frac{(U_i^{m+1} - U_j^{m+1}) + (U_i^m - U_j^m)}{2} = R_{ij} \frac{I_{ij}^{m+1} + I_{ij}^m}{2} \quad (58)$$

[Math. 54]

$$\frac{(U_i^{m+1} - U_j^{m+1}) + (U_i^m - U_j^m)}{2} = L_{ij} \frac{I_{ij}^{m+1} + I_{ij}^m}{2} \quad (59)$$

[Math. 55]

$$\frac{(U_i^{m+1} - U_j^{m+1}) + (U_i^m - U_j^m)}{\Delta t} = \frac{1}{C_{ij}} \frac{I_{ij}^{m+1} + I_{ij}^m}{2} \quad (60)$$

Then, Equations (58) to (60) can be generalized as follows.

[Math. 56]

$$(U_i^{m+1} - U_j^{m+1}) - Z_{ij} \cdot I_{ij}^{m+1} = -\gamma_{ij}(U_i^m - U_j^m) + \delta_{ij} \cdot Z_{ij} \cdot I_{ij}^m \quad (61)$$

Here, when $Z_{ij} = R_{ij}$, $\gamma_{ij} = 1$ and $\delta_{ij} = 1$, when $Z_{ij} = 2L_{ij}/\Delta t$, $\gamma_{ij} = 1$ and $\delta_{ij} = -1$, and when $Z_{ij} = \Delta t/2C_{ij}$, $\gamma_{ij} = -1$ and $\delta_{ij} = 1$.

When the power supply $V_{ij}$ is further connected between the transmission lines i and j, the following equation may be applied in consideration of discretized $V_{ij}$ in Equation (61).

[Math. 57]

$$(U_i^{m+1} - U_j^{m+1}) - Z_{ij} \cdot I_{ij}^{m+1} = -\gamma_{ij}(U_i^m - U_j^m) + \delta_{ij} \cdot Z_{ij} \cdot I_{ij}^m + V_{ij}^{m+1} + V_{ij}^m \quad (62)$$

In addition, as the boundary condition formula, the following relational expression is obtained at the connection node i between the transmission line i and the power supply or load from the law of current conservation.

[Math. 58]

$$\beta \cdot I_j^{m+1} + \Sigma_{j(\neq i)} I_{ij}^{m+1} = 0 \quad (63)$$

Here, when k=0, $\beta=1$ since the direction of the current is a direction of flowing out from the connection node, and when k=N, $\beta=-1$ since the direction of the current is a direction of flowing into the connection node.

Note that the method of setting the boundary condition as described above can be similarly applied to a case where the element is a mutual inductor or a cascade power supply.

<Calculation at Boundary Condition (k=0)>

The value of the scalar potential U and the current I at the boundary condition of k=0 can be obtained by solving the simultaneous equations of Equations (51), (62), and (63). Equations (51), (62), and (63) can be collectively represented in the form of, for example, the following matrix.

[Math. 59]

$$\begin{pmatrix} A_d^T & -Z_d \\ 0 & A_d \end{pmatrix} \begin{pmatrix} Uv_0^{m+1} \\ vI_0^{m+1} \end{pmatrix} = \\ -\begin{pmatrix} \gamma_d \cdot A_d^T & -\delta_d \cdot Z_d \\ 0 & 0 \end{pmatrix} \begin{pmatrix} Uv_0^m \\ vI_0^m - 2vI_{1/2}^{m+1/2} \end{pmatrix} + \begin{pmatrix} Vv^{m+1} + Vv^m \\ 0 \end{pmatrix} \quad (64)$$

$A_d$ in Equation (64) is a connection matrix indicating the presence or absence of involvement in each node connection at each node and the presence or absence of connection with each transmission line. For example, in the configuration of FIG. 1, three nodes (1 to 3) indicated by solid circles can be conceived on the power supply side where k=0 (x=0). These are regarded as the row direction, and the presence or absence of involvement with the inter-node connection (in this case, between the nodes 12 and 23) and the presence or absence of connection with the three transmission lines (1 to 3) are expressed in the column direction as follows.

[Math. 60]

$$A_d = \begin{pmatrix} 1 & 0 & 1 & 0 & 0 \\ -1 & 1 & 0 & 1 & 0 \\ 0 & -1 & 0 & 0 & 1 \end{pmatrix} \quad (65)$$

That is, in this case, since the node 1 relates to the connection between the nodes 12 and is connected to the transmission line 1 and the current is defined to flow out respectively, 1 is allocated to the first and third columns respectively. On the other hand, since there is no connection to the connection between the nodes 23 and the connection with the transmission lines 2 and 3, 0 is arranged in the second, fourth, and fifth columns. In addition, since the node 2 relates to the connection between the nodes 12 and 23 and is connected to the transmission line 2 and defined from the direction of the current flowing from the node 1, −1 is arranged in the first column. Since it is defined as the direction in which the current flows out to the node 3 and the transmission line 2, 1 is arranged in the second and fourth columns. On the other hand, since there is no connection with the transmission lines 1 and 3, 0 is arranged in the third and fifth columns. Further, since the node 3 relates to the connection between the nodes 23 and is connected to the transmission line 3 and the node 3 is defined the direct on in which the current flows from the node 2, −1 is arranged in the second column. Since it is defined as the direct on in which the current, flows out to the transmission line 3, 1 is arranged in the fifth column. On the other hand, since there is no connection to the connection between the nodes 12 and connection with the transmission lines 1 and 2, 0 is allocated to the first, third, and fourth columns. By constructing the matrix in this manner, for example, when the description of k=0 is omitted and the calculation of $A_d^T \cdot Uv^{m+1}$ on the left side of Equation (64) is described,

[Math. 61]

$$A_d^T \cdot Uv^{m+1} = \begin{pmatrix} 1 & -1 & 0 \\ 0 & 1 & -1 \\ 1 & 0 & 0 \\ 0 & 1 & 0 \\ 0 & 0 & 1 \end{pmatrix} \begin{pmatrix} U_1^{m+1} \\ U_2^{m+1} \\ U_3^{m+1} \end{pmatrix} = \begin{pmatrix} U_1^{m+1} - U_2^{m+1} \\ U_2^{m+1} - U_3^{m+1} \\ U_1^{m+1} \\ U_2^{m+1} \\ U_3^{m+1} \end{pmatrix} \quad (66)$$

$(U_i^{m+1} - U_j^{m+1})$ in the first term on the left side of Equation (62) in the first and second rows, and $Uv^{m+1}$ in the first term of the left side of Equation (51) in the third to fifth rows are expressed respectively.

$Z_d$ in Equation (64) is a matrix with the impedance $Z_{ij}$ between the nodes and the characteristic impedance $Zc_{ij}$ between the transmission lines as elements. For example, in the configuration of FIG. 1, $r_{12}$ is connected between the nodes 1 and 2 on the power supply side where k=0 (x=0), $r_{23}$ is connected between the nodes 2 and 3, and there are three transmission lines, and thus, $Z_d$ is expressed as follows.

[Math. 62]

$$Z_d = \begin{pmatrix} r_{12} & 0 & 0 & 0 & 0 \\ 0 & r_{23} & 0 & 0 & 0 \\ 0 & 0 & Zc_{11} & Zc_{12} & Zc_{13} \\ 0 & 0 & Zc_{21} & Zc_{22} & Zc_{23} \\ 0 & 0 & Zc_{31} & Zc_{32} & Zc_{33} \end{pmatrix} \quad (67)$$

$vI_0^{m+1}$ in Equation (64) is a vector having the current $I_{ij}$ flowing between the respective nodes and the current $I_i$ flowing through the respective transmission lines as elements. For example, in the configuration of FIG. 1, $I_{12\,0}^{m+1}$ flows between the nodes 1 and 2 on the power supply side where k=0 (x=0), $I_{23\,0}^{m+1}$ flows between the nodes 2 and 3, and there are three transmission lines, and thus $vI_0^{m+1}$ is expressed as follows.

[Math. 63]

$$vI_0^{m+1} = (I_{12_0}^{m+1} I_{23_0}^{m+1} I_{1_0}^{m+1} I_{2_0}^{m+1} I_{3_0}^{m+1})^T \quad (68)$$

By constituting $Z_d$ and $vI_0^{m+1}$ in this way, the calculation result of $Z_d \cdot vI_0^{m+1}$ on the left side of Equation (64) is a vector in which $Z_{ij} \cdot I_{ij}^{m+1}$ in the second term on the left side of Equation (62) are elements in the first and second rows, and $Zc_d \cdot Iv_0^{m+1}$ of the second term on the left side of Equation (51) are elements in the third to fifth rows. That is, the matrix and vector to which $A_d^T$ or $Z_d$ are applied are expressed by the elements of Equation (62) related to inter-node connection in the first and second rows, and the elements of Equation (51) related to the transmission line in the third to fifth rows. This also applies to the relationship between the right side of Equation (64) and the right side of Equations (62) and (51).

$\gamma_d$ and $\delta_d$ in Equation (64) are diagonal matrices with $\gamma_{ij}$ and $\delta_{ij}$ corresponding to the type of elements connected between nodes as elements. For example, in the configuration of FIG. 1, on the power supply side where k=0 (x=0), the resistor $r_{12}$ is connected between the nodes 1 and 2, and the resistor $r_{23}$ is connected between the nodes 2 and 3. As described in the description of Equation (61), when $Z_{ij}$=resistance $R_{ij}$, $\gamma_{ij}=1$ and $\delta_{ij}=1$. Therefore, $\gamma_d$ and $\delta_d$ are expressed as follows.

[Math. 64]

$$\gamma_d = \begin{pmatrix} 1 & 0 & 0 & 0 & 0 \\ 0 & 1 & 0 & 0 & 0 \\ 0 & 0 & -1 & 0 & 0 \\ 0 & 0 & 0 & -1 & 0 \\ 0 & 0 & 0 & 0 & -1 \end{pmatrix} \quad (69)$$

[Math. 65]

$$\delta_d = \begin{pmatrix} 1 & 0 & 0 & 0 & 0 \\ 0 & 1 & 0 & 0 & 0 \\ 0 & 0 & 1 & 0 & 0 \\ 0 & 0 & 0 & 1 & 0 \\ 0 & 0 & 0 & 0 & 1 \end{pmatrix} \quad (70)$$

In the matrix $\gamma_d$, 1 of the first row and the first column and 1 of the second row and the second column are $y_{ij}=1$ corresponding to $r_{12}$ and $r_{23}$, respectively. Similarly, in the matrix $\delta_d$, 1 of the first row and the first column and 1 of the second row and the second column are $\delta_{ij}=1$ corresponding to $r_{12}$ and $r_{23}$ is, respectively. On the other hand, three diagonal elements of the third row and the third column, the fourth row and the fourth column, and the fifth row and the fifth column correspond to transmission lines 1 to 3, respectively. The transmission line itself has the property of a capacitor. Since $\gamma_{ij}=-1$ and $\delta_{ij}=1$ when $Z_{ij}$=capacitor ($\Delta t/2C_{ij}$) as described in the description of Equation (61), −1 is assigned to the three diagonal elements of $\gamma_d$, and the three diagonal elements of $\delta_d$ are 1.

Since $vI_{1/2}^{m+1/2}$ in Equation (64) is related only to Equation (51), the elements of the first and second rows related to Equation (62) are 0. Therefore, it is expressed as follows.

[Math. 66]

$$vI_{1/2}^{m+1/2} = (0\ 0 I_{1_{1/2}}^{m+1/2} I_{2_{1/2}}^{m+1/2} I_{3_{1/2}}^{m+1/2})^T \quad (71)$$

On the other hand, since $Vv^m$ in Equation (64) relates only to Equation (62), elements in the third to fifth rows related to Equation (51) are zero. Therefore, it is expressed as follows

[Math. 67]

$$Vv^m = (V_{12}^m V_{23}^m 0\ 0\ 0)^T \quad (72)$$

$A_d \cdot vI_0^{m+1}$ on the left side of Equation (64) represents the left side of Equation (63), and the right side (=0) corresponding to $A_d \cdot vI_0^{m+1}$ represents the right side of Equation (63).

In calculating the values of U and I, Equation (64) is transformed as follows, so that the values of U and I at time (m+1)Δt can be obtained from the values of U and I at the preceding time mΔt or (m+1/2)Δt.

[Math. 68]

$$\begin{pmatrix} Uv_0^{m+1} \\ vI_0^{m+1} \end{pmatrix} = -\begin{pmatrix} A_d^T & -Z_d \\ 0 & A_d \end{pmatrix}^{-1} \begin{pmatrix} \gamma_d \cdot A_d^T & -\delta_d \cdot Z_d \\ 0 & 0 \end{pmatrix} \begin{pmatrix} Uv_0^m \\ vI_0^m - 2vI_{1/2}^{m+1/2} \end{pmatrix} + \begin{pmatrix} A_d^T & -Z_d \\ 0 & A_d \end{pmatrix}^{-1} \begin{pmatrix} Vv^{m+1} + Vv^m \\ 0 \end{pmatrix} \quad (73)$$

Equation (63) constituting a part of Equation (64) is a conditional expression in a case where the current source is not included in the circuit. In consideration of the presence of the current source, the following transformation is needed.

When assuming that $A_{dt}$ is a connection matrix indicating the presence or absence of connection with other nodes in each node and the presence or absence of connection with each transmission line and $vtI_0^{m+1}$ is a vector having the current flowing between nodes and the current, flowing through each transmission line as elements, the following relational expression is established from the Kirchhoff's current law.

$$A_{dt} \cdot vtI_0^{m+1} = 0 \quad (74)$$

The connection matrix $A_{dt}$ can be divided into a connection matrix $A_d$ indicating the presence or absence of involvement in the connection between the nodes not including the current source and the presence or absence of connection with each transmission line, and a connection matrix $A_{dJ}$ indicating the presence or absence of involvement in the connection to the nodes including the current source at each node. For example, when the current source flowing from the node 2 to the node 3 is inserted instead of the resistor $r_{23}$ between the nodes 2 and 3 on the power supply side in the configuration of FIG. 1, the connection matrix $A_d$ and the connection matrix $A_{dJ}$ are expressed as follows.

[Math. 69]

$$A_d = \begin{pmatrix} 1 & 1 & 0 & 0 \\ -1 & 0 & 1 & 0 \\ 0 & 0 & 0 & 1 \end{pmatrix} \quad (75)$$

[Math. 70]

$$A_{dJ} = \begin{pmatrix} 0 \\ 1 \\ -1 \end{pmatrix} \quad (76)$$

The connection matrix $A_d$ has the nodes 1 to 3 in the row direction, and the column direction indicates the presence or absence of involvement in each node connection (in this case, between the nodes 12) to which the current source is not connected and the presence or absence of connection with the three transmission lines (1 to 3). That is, in this case, since the node 1 relates to the connection between the nodes 12 and is connected to the transmission line 1 and the current is defined to flow out respectively, 1 is allocated to the first and second columns respectively. On the other hand, since there is no connection to the transmission lines 2 and 3, 0 is arranged. In addition, since the node 2 relates to the connection between the nodes 12 and is connected to the transmission line 2 and defined from the direction of the current flowing from the node 1, −1 is arranged. Since it is defined as the direction in which the current flows out to the transmission line 2, 1 is arranged. On the other hand, since there is no connection with the transmission lines 1 and 3, 0 is arranged. Further, since the node 3 is connected to the transmission line 3 and defined in the direction in which the current flows out to the transmission line 3, 1 is arranged, and since there is no connection with the node 1 and the transmission lines 1 and 2, 0 is arranged. The connection matrix $A_{dJ}$ indicates the presence or absence of involvement in each node connection to each node connection (in this case, between the nodes 23) in which the row direction indicates the nodes 1 to 3 and the current source is connected in the column direction. That is, in this case, since node 1 does not relate to the connection between nodes 23, 0 is arranged to the row of the node 1, and since the nodes 2 and 3 relate to the connection between the nodes 23 and the current flows out from the node 2 and can be considered to flow into the node 3, 1 is arranged to the row of the node 2, and −1 is arranged to the row of the node 3.

For the current vector $vtI_0^{m+1}$, the current $I_{ij0}^{m+1}$ flowing between the respective nodes (in this case, between the nodes 12) to which the current source is not connected and the current $I_{i0}^{m+1}$ flowing in the respective transmission lines (1 to 3 in this case) can be divided into a vector $vI_0^{m+1}$ which is an element and a vector $vI_{J0}^{m+1}$ which is a current $I_{ij0}^{m+1}$ flowing between nodes (in this case, between nodes 23) to which the current source is connected as an element. For example, when the current source flowing from the node 2 to the node 3 is inserted instead of the resistor $r_{23}$ between the nodes 2 and 3 on the power supply side in the configuration of FIG. 1, the vector $vI_{J0}^{m+1}$ is expressed as follows.

[Math. 71]

$$vI_0^{m+1} = \begin{pmatrix} I_{12_0}^{m+1} & I_{1_0}^{m+1} & I_{2_0}^{m+1} & I_{3_0}^{m+1} \end{pmatrix}^T \quad (77)$$

[Math. 72]

$$vI_{J0}^{m+1} = \begin{pmatrix} I_{J_{23}}^{m+1} \end{pmatrix}^T \quad (78)$$

Based on the above, Equation (74) can be rewritten as follows.

[Math. 73]

$$(A_d \quad A_{dJ}) \begin{pmatrix} vI_0^{m+1} \\ vI_{J0}^{m+1} \end{pmatrix} = 0 \quad (79)$$

This equation corresponds to Equation (63) and is a conditional expression when the current source is included in the circuit. Therefore, in this case, the value of the scalar potential U and the current I at the boundary condition of k=0 can be obtained by solving the simultaneous equations of Equations (51), (62), and (79). Equations (51), (62), and (79) can be collectively represented in the form of a matrix as follows, and this equation corresponds to Equation (64) in a case where the current source is not included in the circuit and is an expression in a case where the current source is included in the circuit.

[Math. 74]

$$\begin{pmatrix} A_d^T & -Z_d \\ 0 & A_d \end{pmatrix} \begin{pmatrix} Uv_0^{m+1} \\ vI_0^{m+1} \end{pmatrix} = \quad (80)$$

$$-\begin{pmatrix} \gamma_d \cdot A_d^T & -\delta_d \cdot Z_d \\ 0 & 0 \end{pmatrix} \begin{pmatrix} Uv_0^m \\ vI_0^m - 2vI_{1/2}^{m+1/2} \end{pmatrix} + \begin{pmatrix} Vv^{m+1} + Vv^m \\ -A_{dJ} \cdot vI_{J_0}^{m+1} \end{pmatrix}$$

As can be sees from the comparison with Equation (64), the part related to the current source in Equation (80) is only the second row of the second term on the right side. Then, if the current source is not inserted, when the matrix of all 0 is assigned as $A_{dJ}$ and the vector of all 0 is substituted as $VI_{J0}^{m+1}$, it is exactly the same as Equation (64). That is, Equation (80) can be applied regardless of whether the current source is inserted.

In calculating the values of U and I, Equation (80) is transformed as follows, so that the values of U and I at time $(m+1)\Delta t$ can be obtained from the values of U and I at the preceding time $m\Delta t$ or $(m+1/2)\Delta t$.

[Math. 75]

$$\begin{pmatrix} Uv_0^{m+1} \\ vI_0^{m+1} \end{pmatrix} = -\begin{pmatrix} A_d^T & -Z_d \\ 0 & A_d \end{pmatrix}^{-1} \begin{pmatrix} \gamma_d \cdot A_d^T & -\delta_d \cdot Z_d \\ 0 & 0 \end{pmatrix} \begin{pmatrix} Uv_0^m \\ vI_0^m - 2vI_{1/2}^{m+1/2} \end{pmatrix} + \quad (81)$$

$$\begin{pmatrix} A_d^T & -Z_d \\ 0 & A_d \end{pmatrix}^{-1} \begin{pmatrix} Vv^{m+1} + Vv^m \\ -A_{dJ} \cdot vI_{J_0}^{m+1} \end{pmatrix}$$

Equations (64) and (80) can also be used in so-called lumped constant circuits in which transmission lines are not included. In that case, an equation may be created by using irreducible representation of the connection matrix. In addition, since Equations (64) and (80) are equations consisting of a matrix including partial matrices, the positions of the partial matrices and partial vectors may be substituted as necessary. Even when there is a subordinate power supply that is a model of a transistor or an operational amplifier, it is possible to deal with it by rewriting Equations (64) and (80) as necessary.

<Calculation at Boundary Condition (k=N)>

The value of the scalar potential U and the current I at the boundary condition of k=N can be obtained by solving the simultaneous equations of Equations (54), (62), and (63). The same method can also be applied to a case where the elements are mutual inductors or cascaded power supplies. For example, Equations (54), (62), and (63) can be collectively represented in the form of the following matrix.

[Math. 76]

$$\begin{pmatrix} A_d^T & -Z_d \\ 0 & A_d \end{pmatrix} \begin{pmatrix} Uv_N^{m+1} \\ vI_N^{m+1} \end{pmatrix} = \quad (82)$$

$$-\begin{pmatrix} \gamma_d \cdot A_d^T & -\delta_d \cdot Z_d \\ 0 & 0 \end{pmatrix} \begin{pmatrix} Uv_N^m \\ vI_N^m - 2vI_{N-1/2}^{m+1/2} \end{pmatrix} + \begin{pmatrix} Vv^{m+1} + Vv^m \\ 0 \end{pmatrix}$$

Similarly to $A_d$ of Equation (64), $A_d$ in Equation (82) is a connection matrix indicating the presence or absence of involvement in each node connection at each node and the presence or absence of connection with each transmission line. For example, in the configuration of FIG. 1, five nodes (1 to 5) indicated by solid circles can be conceived on the load side where k=N (x=w). These are regarded as the row direction, and the presence or absence of involvement with the inter-node connection (in this case, between the nodes 14, 42, 23, 45, and 53) and the presence or absence of connection with the three transmission lines (1 to 3) are expressed in the column direction as follows.

[Math. 77]

$$A_d = \begin{pmatrix} 1 & 0 & 0 & 0 & 0 & -1 & 0 & 0 \\ 0 & -1 & 1 & 0 & 0 & 0 & -1 & 0 \\ 0 & 0 & -1 & 0 & -1 & 0 & 0 & -1 \\ -1 & 1 & 0 & 1 & 0 & 0 & 0 & 0 \\ 0 & 0 & 0 & -1 & 1 & 0 & 0 & 0 \end{pmatrix} \quad (83)$$

$Z_d$ in Equation (82) is a matrix with the impedance $Z_{ij}$ between the nodes and the characteristic impedance $Zc_{ij}$ between the transmission lines as elements. For example, in the configuration of FIG. 1, on the load side where k=N (x=w), $Z_d$ is expressed as follows.

[Math. 78]

$$Z_d = \begin{pmatrix} R_{14} & 0 & 0 & 0 & 0 & 0 & 0 & 0 \\ 0 & R_{42} & 0 & 0 & 0 & 0 & 0 & 0 \\ 0 & 0 & R_{23} & 0 & 0 & 0 & 0 & 0 \\ 0 & 0 & 0 & R_{45} & 0 & 0 & 0 & 0 \\ 0 & 0 & 0 & 0 & R_{53} & 0 & 0 & 0 \\ 0 & 0 & 0 & 0 & 0 & Zc_{11} & Zc_{12} & Zc_{13} \\ 0 & 0 & 0 & 0 & 0 & Zc_{21} & Zc_{22} & Zc_{23} \\ 0 & 0 & 0 & 0 & 0 & Zc_{31} & Zc_{32} & Zc_{33} \end{pmatrix} \quad (84)$$

For example, in the configuration of FIG. 1, on the load side where k=N (x=w), $vI_0^{m+1}$ in Equation (82) is expressed as follows.

[Math. 79]

$$vI_N^{m+1} = (I_{14_N}^{m+1} I_{42_N}^{m+1} I_{23_N}^{m+1} I_{45_N}^{m+1} I_{53_N}^{m+1} I_{1_N}^{m+} \quad 1 I_{2_N}^{m+1} I_{3_N}^{m+1})^T \quad (85)$$

$\gamma_d$ and $\delta_d$ in Equation (82) are diagonal matrices with $\gamma$ and $\delta$ corresponding to the type of elements connected between nodes as elements. For example, in the configuration of FIG. 1, since all resistors R are connected, $\gamma_d$ and $\delta_d$ are expressed on the load side where k=N (x=w) as follows.

[Math. 80]

$$\gamma_d = \begin{pmatrix} 1 & 0 & 0 & 0 & 0 & 0 & 0 & 0 \\ 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \\ 0 & 0 & 0 & 0 & 0 & -1 & 0 & 0 \\ 0 & 0 & 0 & 0 & 0 & 0 & -1 & 0 \\ 0 & 0 & 0 & 0 & 0 & 0 & 0 & -1 \end{pmatrix} \quad (86)$$

[Math. 81]

$$\delta_d = \begin{pmatrix} 1 & 0 & 0 & 0 & 0 & 0 & 0 & 0 \\ 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \\ 0 & 0 & 0 & 0 & 0 & 0 & 0 & 1 \end{pmatrix} \quad (87)$$

$vI_{N-1/2}{}^{m+1/2}$ in Equation (82) is expressed as follows.

[Math. 82]

$$vI_{N-1/2}{}^{m+1/2}=(0\ 0\ 0\ 0\ 0\ I_{1_{N-1/2}}{}^{m+1/2} I_{2_{N-1/2}}{}^{m+1/2} I_{3_{N-1/2}}{}^{m+1/2})^T \quad (88)$$

On the other hand, $Vv^m$ in Equation (82) is expressed as follows.

[Math. 83]

$$Vv^m = (V_{14}{}^m V_{42}{}^m V_{23}{}^m V_{45}{}^m V_{53}{}^m\ 0\ 0\ 0)^T \quad (89)$$

In calculating the values of U and I, Equation (82) is transformed as follows, so that the values of U and I at time $(m+1)\Delta t$ can be obtained from the values of U and I at the preceding time $m\Delta t$ or $(m+1/2)\Delta t$.

[Math. 84]

$$\begin{pmatrix} Uv_N^{m+1} \\ vI_N^{m+1} \end{pmatrix} = -\begin{pmatrix} A_d^T & -Z_d \\ 0 & A_d \end{pmatrix}^{-1} \begin{pmatrix} \gamma_d \cdot A_d^T & -\delta_d \cdot Z_d \\ 0 & 0 \end{pmatrix} \begin{pmatrix} Uv_N^m \\ vI_N^m - 2vI_{N-1/2}^{m+1/2} \end{pmatrix} + \begin{pmatrix} A_d^T & -Z_d \\ 0 & A_d \end{pmatrix}^{-1} \begin{pmatrix} Vv^{m+1} + Vv^m \\ 0 \end{pmatrix} \quad (90)$$

Equation (63) constituting a part of Equation (82) is a conditional expression in a case where the current source is not included in the circuit. Thus, when considering the presence of the current source, Equation (79) may be applied instead of Equation (63), similarly to the calculation at the boundary condition (k=0). Therefore, in this case, the value of the scalar potential U and the current I at the boundary condition of k=N can be obtained by solving the simultaneous equations of Equations (54), (62), and (79). Equations (54), (62), and (79) can be collectively represented in the form of a matrix as follows, and this equation corresponds to Equation (82) in a case where the current source is not included in the circuit and s an expression in a case where the current source is included in the circuit.

[Math. 85]

$$\begin{pmatrix} A_d^T & -Z_d \\ 0 & A_d \end{pmatrix} \begin{pmatrix} Uv_N^{m+1} \\ vI_N^{m+1} \end{pmatrix} = \\ -\begin{pmatrix} \gamma_d \cdot A_d^T & -\delta_d \cdot Z_d \\ 0 & 0 \end{pmatrix} \begin{pmatrix} Uv_N^m \\ vI_N^m - 2vI_{N-1/2}^{m+1/2} \end{pmatrix} + \begin{pmatrix} Vv^{m+1} + Vv^m \\ -A_{dJ} \cdot vI_{JN}^{m+1} \end{pmatrix} \quad (91)$$

As can be seen from the comparison with Equation (82), the part related to the current source in Equation (89) is only the second row of the second term on the right side. Then, if the current source is not inserted, when the matrix of all 0 is assigned as $A_{dJ}$ and the vector of all 0 is substituted as $vI_{JN}{}^{m+1}$, it is exactly the same as Equation (82). That is, Equation (91) can be applied regardless of whether the current source is inserted.

In calculating the values of U and I, Equation (91) is transformed as follows, so that the values of U and I at time $(m+1)\Delta t$ can be obtained from the values of U and I at the preceding time $m\Delta t$ or $(m+1/2)\Delta t$.

[Math. 86]

$$\begin{pmatrix} Uv_N^{m+1} \\ vI_N^{m+1} \end{pmatrix} = -\begin{pmatrix} A_d^T & -Z_d \\ 0 & A_d \end{pmatrix}^{-1} \begin{pmatrix} \gamma_d \cdot A_d^T & -\delta_d \cdot Z_d \\ 0 & 0 \end{pmatrix} \begin{pmatrix} Uv_N^m \\ vI_N^m - 2vI_{N-1/2}^{m+1/2} \end{pmatrix} + \\ \begin{pmatrix} A_d^T & -Z_d \\ 0 & A_d \end{pmatrix}^{-1} \begin{pmatrix} Vv^{m+1} + Vv^m \\ -A_{dJ} \cdot vI_{JN}^{m+1} \end{pmatrix} \quad (92)$$

Equations (82) and (91) can also be used in so-called lumped constant circuits in which transmission lines are not included. In that case, an equation may be created by using irreducible representation of the connection matrix. In addition, since Equations (82) and (91) are equations consisting of a matrix including partial matrices, the positions of the partial matrices and partial vectors may be substituted as necessary. Even when there is a subordinate power supply that is a model of a transistor or an operational amplifier, it is possible to deal with it by rewriting Equations (82) and (91) as necessary.

<Calculation of Antenna Term>

In calculating the values of the antenna terms ~U and ~A by the FDTD method,

[Math. 87]

$$\tilde{U}(t, x) = \frac{1}{4\pi\varepsilon} \int_0^w dx' \frac{Q_t(t - \sqrt{|x-x'|}/c, x') - Q_t(t, x)}{|x - x'|} \quad (11)$$

[Math. 88]

$$\tilde{A}(t, x) = \frac{\mu}{4\pi} \int_0^w dx' \frac{I_t(t - \sqrt{|x-x'|}/c, x') - I_t(t, x)}{|x - x'|} \quad (12)$$

are discretized.

For example, at the position $x = k \cdot \Delta x$ on each transmission line and time $t = m \cdot \Delta t$, Equation (11) can be discretized as follows.

[Math. 89]

$$\tilde{U}_k^{m+1} = \quad (93)$$

$$\frac{1}{4\pi\varepsilon} \left[ \sum_{k'=0}^{k} \frac{Qt_{k'}^{m+1-(k-k')} - Qt_k^{m+1}}{k - k'} + \sum_{k'=k}^{N} \frac{Qt_{k'}^{m+1+(k-k')} - Qt_k^{m+1}}{-(k - k')} \right]$$

Here, when $Qt_k^m$ is the total charge of all the transmission lines at the position $x = \cdot \Delta x$ and the time $t = m \cdot \Delta t$ on the transmission line, and $It_k^m$ is the total current on all the transmission lines at the position $x = k \cdot \Delta x$ on the transmission line and the time $t = m \cdot \Delta t$, $Qt_k^{m+1}$ can be calculated by, for example,

[Math. 90]

$$\frac{Qt_k^{m+1} - Qt_k^m}{\Delta t} + \frac{It_{k+1/2}^{m+1/2} - It_{k-1/2}^{m+1/2}}{\Delta x} = 0 \qquad (94)$$

In addition, at a position $x=(k+1/2)\cdot\Delta x$ on the transmission line and time $t=(m+1/2)\cdot\Delta t$, Equation (12) can be discretized as follows.

[Math. 91]

$$\sim A_{k+1/2}^{m+1/2} = \qquad (95)$$

$$\frac{\mu}{4\pi}\left[\sum_{k'=0}^{k}\frac{It_{k'+1/2}^{m+1/2-(k-k')} - It_{k+1/2}^{m+1/2}}{k-k'} + \sum_{k'=k}^{N}\frac{It_{k'+1/2}^{m+1/2+(k-k')} - It_{k+1/2}^{m+1/2}}{-(k-k')}\right]$$

Therefore, values of ~U and ~A can be calculated from previously given or previously calculated charge and current values.

<Overall Calculation Procedure>

Figure 2:
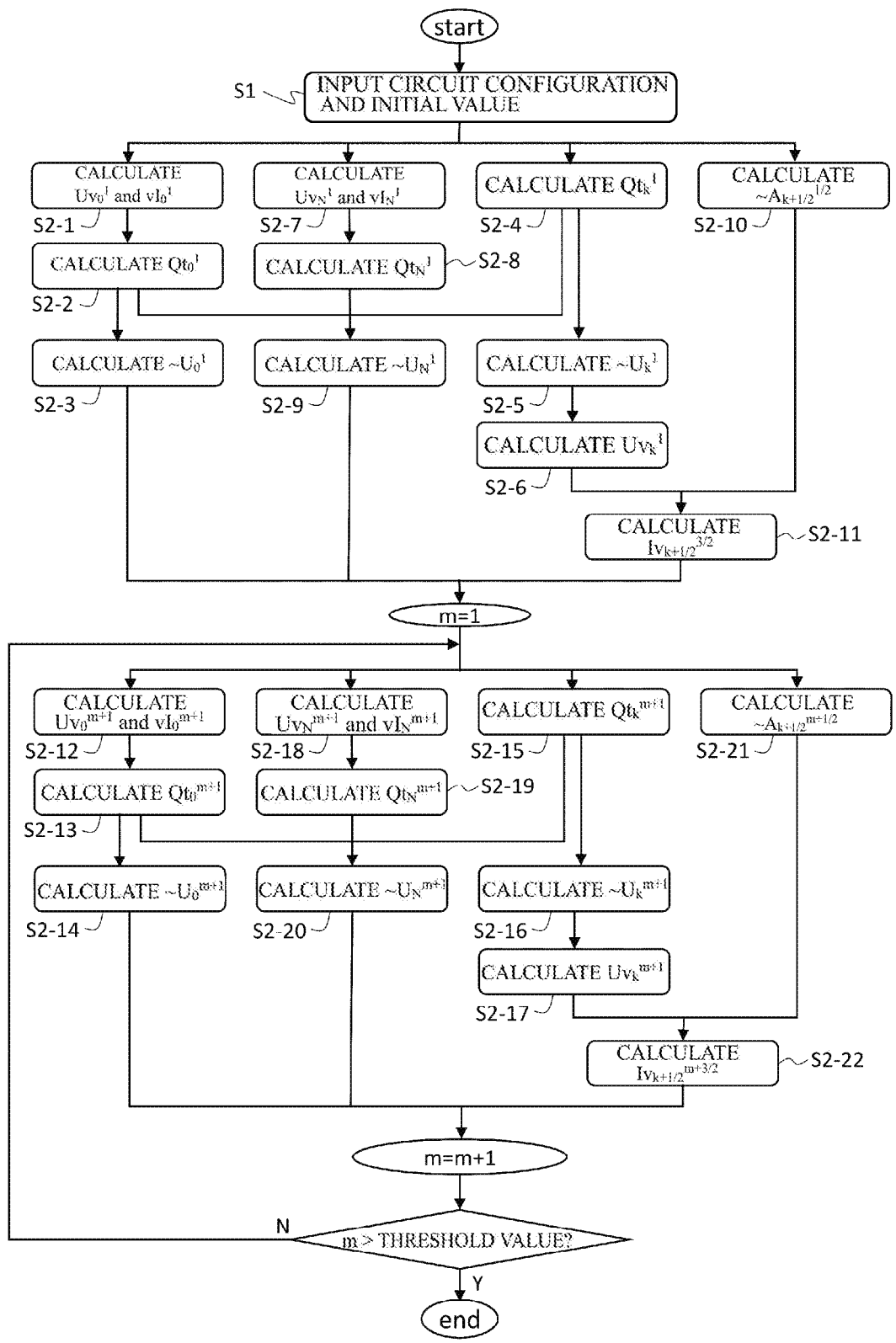
FIG. 2 is a diagram illustrating an example of a calculation flow of a calculation method of the present invention.

The overall procedure of calculating the potential and current in the multi-conductor transmission line constituting the distributed constant circuit, the potential and current in the element constituting the lumped constant circuit connected to the multi-conductor transmission line, and the electromagnetic field including noise generated from each circuit will be described with reference to FIG. 2.

Prior to the calculation, the circuit configuration such as arrangement of elements and nodes is specified, and initial values of potential, current, charge, and antenna term are set for each transmission line and each element (S1). The initial value is set for a parameter value which is not obtained prior to calculation by each of the following calculation expressions at m=0. In addition, if there is a power supply between the nodes, the value is preset.

Subsequently, the potential, the current, the charge, and the antenna term are calculated (S2).

First, the calculation is performed at m=0. Note that the order of calculation may be appropriately changed according to how to set the initial value or the like.

First, $Uv_0^1$ and $vI_0^1$ are calculated by Equation (81) (S2-1). Next, in the case of k=0 in Equation (94), an initial value is substituted into each parameter to calculate $Qt_0^1$ (S2-2). In this case, $It_{k-1/2}^{1/2}$ becomes $It_{-1/2}^{1/2}$ when k=0 and it is out of the definition range of the grid (x<0). In this case, an initial value may be given, but $(I_0^1+I_0^0)/2$ may be obtained from $I_0^1$ calculated in S2-1 and $I_0^0$ given as the initial value so that it falls within the definition range and the error is small.

Next, in the case of k=0 in Equation (93), the initial value and the calculation result of $Qt_0^1$ obtained in S2-2 are substituted into each parameter to calculate $\sim U_0^1$ (S2-3). Then, for each case of k=1, 2, . . . , N−1 in Equation (94), the initial values are substituted into the respective parameters to calculate $Qt_1^1, Qt_2^1, \ldots Qt_{N-1}^1$ (S2-4).

Next, for each case of k=1, 2, . . . , N−1 in Equation (93), the initial value and the calculation result of $Qt_k^1$ obtained in S2-4 are substituted into each parameter to calculate $\sim U_1^1, \sim U_2^1, \ldots \sim U_{N-1}^1$ respectively (S2-5).

Next, for each case of k=1, 2, . . . , N−1 in Equation (47), the initial values are substituted into each parameter and calculation results of $\sim U_k1$ obtained in S2-5 to calculate $Uv_1^1, Uv_2^1, \ldots Uv_{N-1}^1$ (S2-6).

Next, $Uv_N^1$ and $vI_N^1$ are calculated by substituting the initial value into each parameter by Equation (92) (S2-7).

Next, in the case of k=N in Equation (94), an initial value is substituted into each parameter to calculate $Qt_N^1$ (S2-8). In this case, $It_{k+1/2}^{1/2}$ becomes $It_{N+1/2}^{1/2}$ when k=N and it is out of the definition range of the grid (x>w) In this case, an initial value may be given, but $(I_N^1+I_N^0)$ may be obtained from $I_N^1$ calculated in S2-7 and $I_N^0$ given as the initial value so that it falls within the definition range and the error is small.

Next, with respect to the case of k=N in Equation (93), the initial value, the calculation result of $Qt_0^1$ obtained in S2-2, the calculation result of $Qt_k^1$ obtained in S2-4, and the calculation result of $Qt_N^1$ obtained in S2-8 are substituted into each parameter to calculate $\sim U_N^1$ (S2-9).

Next, for each case of k=0, 1, . . . , N−1 in Equation (95), the initial value is substituted into each parameter to calculate $\sim A_{1/2}^{1/2}, \sim A_{3/2}^{1/2}, \ldots \sim A_{N-1/2}^{1/2}$ respectively (S2-10).

Next, for each case of k=0, 1, . . . , N−1 in Equation (48), the initial value, the calculation result of $Uv_k^1$ obtained in S2-6, and the calculation result of $\sim A_{k+1/2}^{1/2}$ obtained in S2-10 are substituted into each parameter to calculate $I_{v1/2}^{3/2}, I_{v3/2}^{3/2}, \ldots, I_{vN-1/2}^{3/2}$ (S2-11).

Subsequently, the calculation is performed at m=1. As long as the parameter values necessary for calculation are already calculated, the order of calculation may be changed as appropriate.

First, the calculation results of $Uv_0^1$ and $vI_0^1$ obtained in S2-1 and the calculation result of $I_{1/2}^{3/2}$ obtained in S2-11 are substituted into each parameter of Equation (81) to calculate $Uv_0^2$ and $vI_0^2$ (S2-12).

Next, in the case of k=0 in Equation (94), the calculation result of $Qt_0^1$ obtained in S2-2 and the calculation result of $I_{1/2}^{3/2}$ obtained in S2-11 are substituted into each parameter to calculate $Qt_0^2$ (S2-13). In this case, $It_{k-1/2}^{3/2}$ becomes $It_{-1/2}^{3/2}$ when k=0 and it is out of the definition range of the grid (x<0). Therefore, the initial value maybe given, but $(I_0^2+I_0^1)/2$ may be obtained from $I_0^2$ calculated in S2-12 and $I_0^1$ calculated in S2-1 so that it falls within the definition range and the error is small.

Next, with respect to the case of k=0 in Equation (93), the initial value, the calculation result of $Qt_0^1$ obtained in S2-2, the calculation result of $Qt_k^1$ obtained in S2-4, and the calculation result of $Qt_N^1$ obtained in S2-8 are substituted into each parameter to calculate $\sim U_0^2$ (S2-14).

Next, for each case of k=1, 2, . . . , N−1 in Equation (94), the calculation result of $Qt_k^1$ obtained in S2-4 and the calculation result of $I_{k-1/2}^{3/2}$ obtained in S2-11 are substituted into each parameter to calculate $Qt_1^2, Qt_2^2, \ldots Qt_{N-1}^2$ respectively (S2-15).

Next, for each case of k=1, 2, . . . , N−1 in Equation (93), the initial value, the calculation result of $Qt_k^1$ obtained in S2-4, and the calculation result of $Qt_k^2$ obtained in S2-15 are substituted into each parameter to calculate $\sim U_1^2, \sim U_2^2, \ldots \sim U_{N-1}^2$ (S2-16).

Next, for each case of k=1, 2, . . . , N−1 in Equation (47), the calculation result of $\sim U_k^1$ obtained in S2-5, the calculation result of $Uv_k^1$ obtained in S2-6, the calculation result of $I_{k-1/2}^{3/2}$ obtained in S2-11, and the calculation result of $\sim U_k^2$ obtained in S2-16 are substituted into each parameter to calculate $Uv_1^2, Uv_2^2, \ldots Uv_{N-1}^2$ respectively (S2-17).

Next, the calculation results of $Uv_N^1$ and $vI_N^1$ obtained in S2-7 and the calculation result of $I_{N-1/2}3/2$ obtained in S2-11 are substituted into each parameter of Equation (92) to calculate $Uv_N^2$ and $vI_N^2$ (S2-18).

Next, in the case of k=N in Equation (94), the calculation result of $Qt_N^1$ obtained in S2-8 and the calculation result of $I_{N-1/2}^{3/2}$ obtained in S2-11 are substituted into each parameter to calculate $Qt_N^2$ (S2-19). In this case, $It_{k+1/2}^{3/2}$ becomes $It_{N+1/2}^{3/2}$ when k=N and it is out of the definition range of the grid (x>w). Therefore, the initial value maybe given, but $(I_N^2+I_N^1)/2$ may be obtained from $I_N^2$ calculated in S2-18 and $I_N^1$ calculated in S2-7 so that it falls within the definition range and the error is small.

Next, for the case of k=N in Equation (93), the initial value, the calculation result of $Qt_0^1$ obtained in S2-2, the calculation result of $Qt_k^1$ obtained in S2-4, the calculation result of $Qt_N^1$ obtained in S2-9, the calculation result of $Qt_0^2$ obtained in S2-13, the calculation result of $Qt_k^2$ obtained in S2-15, and the calculation result of $Qt_N^2$ obtained in S2-19 are substituted into each parameter to calculate $\sim U_N^2$ (S2-20). Next, in each case of k=0, 1, . . . , N−1 in Equation (95), the calculation result of $I_{k+1/2}^{3/2}$ obtained in S11 is substituted into each parameter to calculate $\sim A_{1/2}^{3/2}$, $\sim A_{3/2}^{3/2}$, . . . $\sim A_{N-1/2}^{3/2}$ (S2-21).

Next, for each case of k=0, 1, . . . , N−1 in Equation (48), the calculation result of $\sim A_{k+1/2}^{1/2}$ obtained in S2-10, the calculation result of $I_{k+1/2}^{3/2}$ obtained in S2-11, the calculation result of $Uv_0^2$ obtained in S2-12, the calculation result of $Uv_k^2$ obtained in S2-17, the calculation result of $Uv_N^2$ obtained in S2-18, and the calculation result of $\sim A_{k+1/2}^{3/2}$ obtained in S2-21 are substituted into each parameter to calculate $Iv_{1/2}^{5/2}$, $Iv_{3/2}^{5/2}$, . . . , $Iv_{N-1/2}^{5/2}$ respectively (S2-22).

Even at m≥2, S2-12 to S2-22 are repeatedly executed up to a predetermined value m while increasing m by 1, and $Uv_0^{m+1}$, $vI_0^{m+1}$, $Qt_0^{m+1}$, $\sim U_0^{m+1}$, $Qt_k^{m+1}$, $\sim U_k^{m+1}$, $Uv_k^{m+1}$, $Uv_N^{m+1}$, $vI_N^{m+1}$, $Qt_N^{m+1}$, $\sim U_N^{m+1}$, $\sim A_{k+1/2}^{m+1/2}$, and $Iv_{k+1/2}^{m+3/2}$ are obtained.

As described above, according to the method for calculating the potential, the current, and the peripheral electromagnetic field in the electric circuit according to the present invention, it is possible to comprehensively calculate the potential and the current in the multi-conductor transmission line constituting the distributed constant circuit, the potential and the current in the elements constituting the lumped constant circuit connected to the multi-conductor transmission line, and the electromagnetic field including the noise generated from each circuit, without performing a complicated calculation process.

Each process in the method for calculating the potential, the current, and the peripheral electromagnetic field in the electric circuit according to the present invention maybe merged, divided, or changed in order as necessary. In addition, appropriately changes can be made thereto within the scope of the technical idea expressed in the present invention, and such modifications or improvements also fall within the technical scope of the present invention.

When causing a computer to execute the method for calculating the potential, the current, and the peripheral electromagnetic field in the electric circuit according to the present invention, the processing contents in each processing step are described by a program. The program is stored in, for example, a hard disk device, and at the time of execution, necessary programs and data are read into a random access memory (RAM), and the program is executed by a CPU, whereby each processing contents are realized on the computer.

The invention claimed is:

1. A non-transitory computer readable computer medium encoded with a computer program product for causing a computer to execute a method for calculating a potential, a current, and a peripheral electromagnetic field in an electric circuit, which causes a computer to calculate a potential and a current in a multi-conductor transmission line constituting a distributed constant circuit, a potential and a current in an element constituting a lumped constant circuit connected to the multi-conductor transmission line, and an electromagnetic radiation amount from each circuit, the method comprising:

inputting a circuit configuration of the distributed constant circuit and the lumped constant circuit and an initial value of each variable; and obtaining the potential and the current in the multi-conductor transmission line, the potential and the current in the element, and the electromagnetic radiation amount by solving:

under the circuit configuration and the initial value, the following basic equations of new transmission theory:

[Math. 1]
$$\frac{\partial U_i(t,x)}{\partial t} = -\sum_{j=1}^{n} P_{ij} \cdot \frac{\partial I_j(t,x)}{\partial x} + \frac{\partial \sim U(t,x)}{\partial t} \quad (1)$$

[Math. 2]
$$\frac{\partial U_i(t,x)}{\partial x} = -\sum_{j=1}^{n} L_{ij} \cdot \frac{\partial I_j(t,x)}{\partial t} - \frac{\partial \sim A(t,x)}{\partial t} - R_i \cdot I_i(t,x) \quad (2)$$

[Math. 3]
$$\sim U(t,x) = \frac{1}{4\pi\varepsilon} \int_0^w dx' \frac{Q_t(t-\sqrt{|x-x'|}/c,x') - Q_t(t,x)}{|x-x'|} \quad (3)$$

[Math. 4]
$$\sim A(t,x) = \frac{\mu}{4\pi} \int_0^w dx' \frac{I_t(t-\sqrt{|x-x'|}/c,x') - I_t(t,x)}{|x-x'|} \quad (4)$$

(t is a time, x and x' are positions on each transmission line (x>x'), i, j (=1, 2, . . . , n) is the number of each transmission line, $U_i(t,x)$ and $A_i(t,x)$ are scalar potential (potential) and vector potential of a transmission line i at time t and a position x, respectively, $I_j(t,x)$ is a current flowing in a transmission line j at the time t and the position x, $P_{ij}$ and $L_{ij}$ are a potential coefficient and an induction coefficient between the transmission lines i and j respectively, $R_i$ is a resistance per unit length of the transmission line i, $\sim U(t,x)$ and $\sim A(t,x)$ are antenna terms indicating the electromagnetic radiation amount at the time t and the position x, $\varepsilon$ is a permittivity, $\mu$ is a permeability, and $Q_t(t,x)$ and $I_t(t,x)$ are a charge and a current of all transmission lines at the time t and the position x)

using a boundary condition formula at x=0 and w which are boundaries between the distributed constant circuit and the lumped constant circuit:

$$U_i(t,x) - U_j(t,x) = V_{ij}(t) + Z_{ij} \cdot \Delta \cdot I_{ij}(t) \quad (5), \text{and}$$

Kirchhoff's current law, that is, a summation formula in which an algebraic sum of branch currents of all the branches flowing into one node is zero, that is, a current flowing out from the node is positive and a current entering the node is negative:

$$\alpha \cdot I_i(t,x) + \Sigma_{j(\neq i)} I_{ij}(t) = 0 \quad (6)$$

($V_{ij}(t)$ is a power supply voltage connected between the transmission line or the nodes i, j(≠i) at the time t on the lumped constant circuit side, $I_{ij}(t)$ is a current flowing between the transmission lines or from the node i to the node ($\neq$i) at the time t on the lumped constant circuit side, $Z_{ij}$ is a load connected between the transmission lines or the nodes i, j($\neq$i), $\Delta$ is 1 when $Z_{ij}=R_{ij}$, d/dt when $Z_{ij}=L_{ij}$, and $(d/dt)^{-1}$ when $Z_{ij}=1/C_{ij}$, and $\alpha$ is 1 when x=0 and −1 when x=w), wherein in the obtaining of the potential and the current in the multi-conductor transmission line, the basic equation is solved by using an FDTD method, and wherein when a scalar potential at a position x=k·$\Delta$x (k=0, 1, . . . , N, w=N·$\Delta$x) and time t=m·$\Delta$t (m=0, 1, . . . , arbitrary) on the transmission line i is $U_k^m$, a current is denoted as $I_k^m$, $Uv_k^m$ is a vector with $U_k^m$ as an element for each transmission line i, $Iv_k^m$ is a vector whose elements are $I_k^m$ for each transmission line i, $P_d$ is a matrix whose elements are $P_{ij}$, $L_d$ is a matrix whose elements are $L_{ij}$, and $R_d$ is a matrix whose diagonal element is $R_i$, in Equation (1),

[Math. 5]

$$\frac{Uv_k^{m+1} - Uv_k^m}{\Delta t} = -P_d \frac{Iv_{k+1/2}^{m+1/2} - Iv_{k-1/2}^{m+1/2}}{\Delta x} + \frac{\sim U_k^{m+1} - \sim U_k^m}{\Delta t} \quad (7)$$

a discretized equation is used, and in Equation (2)

[Math. 6]

$$\frac{Uv_{k+1}^{m+1} - Uv_k^{m+1}}{\Delta x} = \quad (8)$$
$$-L_d \frac{Iv_{k+1/2}^{m+3/2} - Iv_{k+1/2}^{m+1/2}}{\Delta t} - \frac{\sim A_{k+1/2}^{m+1/2} - \sim A_{k+1/2}^{m-1/2}}{\Delta t} - R_d \frac{Iv_{k+1/2}^{m+3/2} - Iv_{k+1/2}^{m+1/2}}{2}$$

a discretized equation is used, wherein the Equation (1) and Equation (2) are calculated, via a processor of the computer, using a Finite Difference Time Domain (FDTD) method, wherein the FDTD method is performed using a grid structure that shifts a grid where an unknown electric field is arranged by a half width of the grid, wherein the unknown electric field and a magnetic field are updated in units of certain time steps to obtain a whole electromagnetic field behavior, wherein the electric field and the magnetic field are obtained alternatively by updating by the certain time steps, wherein, the updating by the certain time steps includes updating the magnetic field after 1/2 time step and updating the electric field after one time step, and wherein the updating by the certain time steps simulates a temporal change of the electromagnetic field to allow an efficient design of the electrical circuit by the processor which accommodates expected noise at a design stage of the electrical circuit.

2. The non-transitory computer readable computer medium encoded with the computer program product for causing the computer to execute the method for calculating the potential, the current, and the peripheral electromagnetic field in the electric circuit according to claim 1, wherein when $Zc_d$ is a matrix having a characteristic impedance $Zc_{ij}$ between the transmission lines i and j as an element, Equation (7) is used when k=0 which is a boundary of one of the distributed constant circuit and the lumped constant circuit,

[Math. 7]

$$Uv_0^{m+1} - Zc_d \cdot Iv_0^{m+1} = Uv_0^m + Zc_d \cdot (Iv_0^m - 2Iv_{1/2}^{m+1/2}) \quad (9)$$

and, at k=N which is the other boundary,

[Math. 8]

$$-Uv_N^{m+1} - Zc_d \cdot Iv_N^{m+1} = -Uv_N^m + Zc_d \cdot (Iv_N^m - 2Iv_{N-1/2}^{m+1/2}) \quad (10)$$

Equations (9) and (10) are solved using the following discretized boundary condition formulas for k=0 and N corresponding to Equations (5) and (6),

[Math. 9]

$$(U_i^{m+1} - U_j^{m+1}) - Z_{ij} \cdot I_{ij}^{m+1} = -\gamma_{ij}(U_i^m - U_j^m) + \delta_{ij} \cdot Z_{ij} \cdot I_{ij}^m + V_{ij}^{m+1} + V_{ij}^m \quad (11)$$

(when $Z_{ij}=R_{ij}$, $\gamma=1$ and $\delta=1$, when $Z_{ij}=2L_{ij}/\Delta t$, $\gamma=1$ and $\delta=-1$, and when $Z_{ij}=\Delta t/2C_{ij}$, $\gamma=-1$ and $\delta=1$)

[Math. 10]

$$\beta \cdot I_j^{m+1} + \Sigma_{j(\neq i)} I_{ij}^{m+1} = 0 \quad (12)$$

($\beta$ is 1 when k=0 and −1 when k=N).

3. The non-transitory computer readable computer medium encoded with the computer program product for causing the computer to execute the method for calculating the potential, the current, and the peripheral electromagnetic field in the electric circuit according to claim 2, wherein when a connection matrix indicating the presence or absence of involvement in each node connection and the presence or absence of connection with each transmission line in each node is $A_d$, a vector having the current $I_{ij}$ flowing between the respective nodes and the current $I_i$ flowing through each transmission line as an element is $vI_k^m$, a matrix having elements of the impedance $Z_{ij}$ between the respective nodes and the characteristic impedance $Zc_{ij}$ between the transmission lines is $Z_d$, diagonal matrices with $\gamma$ and $\delta_d$ as elements corresponding to a type of elements connected between the nodes are $\gamma_d$ and $\delta_d$, and a vector having the voltage $V_{ij}$ applied between the nodes as an element is Vv, Equations (9), (11), and (12) are expressed in a form of a matrix:

[Math. 11]

$$\begin{pmatrix} A_d^T & -Z_d \\ 0 & A_d \end{pmatrix} \begin{pmatrix} Uv_0^{m+1} \\ vI_0^{m+1} \end{pmatrix} = \quad (13)$$
$$-\begin{pmatrix} \gamma_d \cdot A_d^T & -\delta_d \cdot Z_d \\ 0 & 0 \end{pmatrix} \begin{pmatrix} Uv_0^m \\ vI_0^m - 2vI_{1/2}^{m+1/2} \end{pmatrix} + \begin{pmatrix} Vv^{m+1} + Vv^m \\ 0 \end{pmatrix}$$

Equations (10), (11), and (12) are expressed in a form of a matrix:

[Math. 12]

$$\begin{pmatrix} A_d^T & -Z_d \\ 0 & A_d \end{pmatrix} \begin{pmatrix} Uv_N^{m+1} \\ vI_N^{m+1} \end{pmatrix} = \quad (14)$$
$$-\begin{pmatrix} \gamma_d \cdot A_d^T & -\delta_d \cdot Z_d \\ 0 & 0 \end{pmatrix} \begin{pmatrix} Uv_N^m \\ vI_N^m - 2vI_{N-1/2}^{m+1/2} \end{pmatrix} + \begin{pmatrix} Vv^{m+1} + Vv^m \\ 0 \end{pmatrix}$$

and each equation is solved.

4. The non-transitory computer readable computer medium encoded with the computer program product for causing the computer to execute the method for calculating the potential, the current, and the peripheral electromagnetic field in the electric circuit according to claim 3, wherein in Equation (12),

[Math. 13]

$$(A_d \ A_{dJ}) = \begin{pmatrix} vI_0^{m+1} \\ vI_{J0}^{m+1} \end{pmatrix} = 0 \quad (15)$$

($A_d$ is a connection matrix indicating the presence or absence of involvement in each node connection not including a current source and the presence or absence of connection with each transmission line in each node, $A_{dJ}$ is a connection matrix indicating the presence or absence of involvement in each node connection including the current source at each node, $vI_0^{m+1}$ is a vector whose elements are a current $I_{ij0}^{m+1}$ flowing between the respective nodes to which no current source is connected and a current $I_{i0}^{m+1}$ flowing through each transmission line, and $I_{J0}^{m+1}$ is a vector whose elements are a current $I_{JiJ0}^{m+1}$ flowing between the nodes to which the current source is connected) is used, and Equations (9), (11), and (15) is expressed in a form of a matrix:

[Math. 14]

$$\begin{pmatrix} A_d^T & -Z_d \\ 0 & A_d \end{pmatrix} \begin{pmatrix} Uv_0^{m+1} \\ vI_0^{m+1} \end{pmatrix} = \quad (16)$$

$$-\begin{pmatrix} \gamma_d \cdot A_d^T & -\delta_d \cdot Z_d \\ 0 & 0 \end{pmatrix} \begin{pmatrix} Uv_0^m \\ vI_0^m - 2vI_{1/2}^{m+1/2} \end{pmatrix} + \begin{pmatrix} Vv^{m+1} + Vv^m \\ -A_{dJ} \cdot vI_{J0}^{m+1} \end{pmatrix}$$

Equations (10), (11), and (15) are expressed in a form of a matrix:

[Math. 15]

$$\begin{pmatrix} A_d^T & -Z_d \\ 0 & A_d \end{pmatrix} \begin{pmatrix} Uv_N^{m+1} \\ vI_N^{m+1} \end{pmatrix} = \quad (17)$$

$$-\begin{pmatrix} \gamma_d \cdot A_d^T & -\delta_d \cdot Z_d \\ 0 & 0 \end{pmatrix} \begin{pmatrix} Uv_N^m \\ vI_N^m - 2vI_{N-1/2}^{m+1/2} \end{pmatrix} + \begin{pmatrix} Vv^{m+1} + Vv^m \\ -A_{dJ} \cdot vI_{JN}^{m+1} \end{pmatrix}$$

and each equation is solved.

5. The non-transitory computer readable computer medium encoded with the computer program product for causing the computer to execute the method for calculating the potential, the current, and the peripheral electromagnetic field in the electric circuit according to claim 4, wherein when a total charge of all the transmission lines at the position $x=k \cdot \Delta x$ and the time $t=m \cdot \Delta t$ on the transmission line is $Qt_k^m$ and a total current at the position $x=k \cdot \Delta x$ on the transmission line and the time $t=m \cdot \Delta t$ is $It_k^m$, a value of $Qt_k^{m+1}$ is calculated by

[Math. 16]

$$\frac{Qt_k^{m+1} - Qt_k^m}{\Delta t} + \frac{It_{k+1/2}^{m+1/2} - It_{k-1/2}^{m+1/2}}{\Delta x} = 0 \quad (18)$$

and a value of an antenna term ~U at the position $x=\cdot \Delta x$ and time $t=(m+1) \cdot \Delta t$ on each transmission line and a value of an antenna term ~A at a position $x=(k+\frac{1}{2}) \cdot \Delta x$ on each transmission line and time $t=(m+\frac{1}{2}) \cdot \Delta t$ are calculated by the following Equations.

[Math. 17]

$$\sim U_k^{m+1} = \quad (19)$$

$$\frac{1}{4\pi\varepsilon} \left[ \sum_{k'=0}^{k} \frac{Qt_{k'}^{m+1-(k-k')} - Qt_k^{m+1}}{k-k'} + \sum_{k'=k+1}^{N} \frac{Qt_{k'}^{m+1+(k-k')} - Qt_k^{m+1}}{-(k-k')} \right]$$

[Math. 18]

$$\sim A_{k+1/2}^{m+1/2} = \quad (20)$$

$$\frac{\mu}{4\pi} \left[ \sum_{k'=0}^{k} \frac{It_{k'+1/2}^{m+1/2-(k-k')} - It_{k+1/2}^{m+1/2}}{k-k'} + \sum_{k'=k+1}^{N} \frac{It_{k'+1/2}^{m+1/2+(k-k')} - It_{k+1/2}^{m+1/2}}{-(k-k')} \right].$$

6. The non-transitory computer readable computer medium encoded with the computer program product for causing the computer to execute the method for calculating the potential, the current, and the peripheral electromagnetic field in the electric circuit according to claim 5, wherein the obtaining of the potential and the current in the multi-conductor transmission line performs:

in m=0,
calculating $Uv_0^1$ and $vI_0^1$ by Equation (16);
calculating $Qt_0^1$ by Equation (18);
calculating $\sim U_0^1$ by Equation (19);
calculating $Qt_k^1$ (k=1, 2, ..., N−1) by Equation (18);
calculating $\sim U_k^1$ (k=1, 2, ..., N−1) by Equation (19);
calculating $Uv_k^1$ (k=1, 2, ..., N−1) by Equation (7);
calculating $Uv_N^1$ and $vI_N^1$ by Equation (17);
calculating $Qt_N^1$ by Equation (18);
calculating $\sim U_N^1$ by Equation (19);
calculating $\sim A_{k+1/2}^{1/2}$ (k=0, 1, ..., N−1) by Equation (20); and
calculating $Iv_{k+1/2}^{3/2}$ (k=0, 1, ..., N−1) by Equation (8), and in m≥1,
calculating $Uv_0^1$ and $vI_0^{m+1}$ by Equation (16);
calculating $Qt_0^{m+1}$ by Equation (18);
calculating $\sim U_0^{m+1}$ by Equation (19);
calculating $Qt_k^{m+1}$ (k=1, 2, ..., N−1) by Equation (18);
calculating $\sim U_k^{m+1}$ (k=1, 2, ..., N−1) by Equation (19);
calculating $UV_k^{m+1}$ (k=1, 2, ..., N−1) by Equation (7);
calculating $UV_N^{m+1}$ and $vI_N^{m+1}$ by Equation (17);
calculating $Qt_N^{m+1}$ by Equation (18);
calculating $\sim U_N^{m+1}$ by Equation (19);
calculating $\sim A_{k+1/2}^{m+1/2}$ (k=0, 1, ..., N−1) by Equation (20); and
calculating $Iv_{k+1/2}^{m+3/2}$ (k=0, 1, ..., N−1) by Equation (8) repeatedly until a value of m reaches a predetermined value while incrementing m by 1.

\* \* \* \* \*